(12) United States Patent
Yuan et al.

(10) Patent No.: US 12,543,461 B2
(45) Date of Patent: Feb. 3, 2026

(54) PIXEL CIRCUIT, DRIVING CONTROL METHOD, DISPLAY SUBSTRATE AND DISPLAY DEVICE

(71) Applicants: Hefei BOE Joint Technology Co., Ltd., Anhui (CN); BOE TECHNOLOGY GROUP CO., LTD., Beijing (CN)

(72) Inventors: Can Yuan, Beijing (CN); Yongqian Li, Beijing (CN); Zhidong Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 105 days.

(21) Appl. No.: 18/557,562

(22) PCT Filed: Jan. 12, 2023

(86) PCT No.: PCT/CN2023/071907
§ 371 (c)(1),
(2) Date: Oct. 26, 2023

(87) PCT Pub. No.: WO2024/148565
PCT Pub. Date: Jul. 18, 2024

(65) Prior Publication Data
US 2025/0098445 A1   Mar. 20, 2025

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *H10K 59/1216* (2023.02);
(Continued)

(58) Field of Classification Search
CPC ............ H10K 59/131; H10K 59/1216; H10K 59/80518; H10K 59/80522; G09G 3/3233;
(Continued)

(56) References Cited

U.S. PATENT DOCUMENTS

2015/0161943 A1   6/2015   Shim et al.
2016/0035808 A1   2/2016   Jung et al.
(Continued)

FOREIGN PATENT DOCUMENTS

CN   104700774 A   6/2015
CN   105321458 A   2/2016
(Continued)

*Primary Examiner* — Adam R. Giesy
(74) *Attorney, Agent, or Firm* — MUNCY, GEISSLER, OLDS & LOWE, P.C.

(57) ABSTRACT

Pixel circuit, driving control method, display substrate and device are disclosed. The pixel circuit includes a driving circuit, a control circuit and a light-emitting module; the driving circuit generates driving current for driving the light-emitting module under control of control end of the driving circuit; the control circuit is connected to first scanning line, power supply voltage line and second end of the driving circuit, and controls connection between the power supply voltage line and the second end of the driving circuit under control of first scanning signal; second end of the light-emitting module is connected to a cathode voltage line. With the control circuit, branch current can be increased by increasing forward and reverse voltages, such that foreign bodies at dark spots can be burnt out and the dark spots can be changed into normal pixels, thereby improving product yield and displaying quality.

20 Claims, 27 Drawing Sheets

(51) Int. Cl.
*H10K 59/121* (2023.01)
*H10K 59/80* (2023.01)

(52) U.S. Cl.
CPC . *H10K 59/80518* (2023.02); *H10K 59/80522* (2023.02); *G09G 2300/0426* (2013.01); *G09G 2300/0842* (2013.01); *G09G 2320/0233* (2013.01); *G09G 2320/046* (2013.01)

(58) Field of Classification Search
CPC ... G09G 2300/0426; G09G 2300/0842; G09G 2320/0233; G09G 2320/046
See application file for complete search history.

(56) References Cited

U.S. PATENT DOCUMENTS

| | | |
|---|---|---|
| 2021/0134917 A1* | 5/2021 | Li ................... G09G 3/3275 |
| 2021/0319744 A1 | 10/2021 | Lee et al. |
| 2022/0149128 A1 | 5/2022 | Shim et al. |
| 2022/0180818 A1 | 6/2022 | Ra et al. |
| 2022/0216284 A1 | 7/2022 | Jeon et al. |

FOREIGN PATENT DOCUMENTS

| | | |
|---|---|---|
| CN | 207068443 U | 3/2018 |
| CN | 111129106 A | 5/2020 |
| CN | 114464652 A | 5/2022 |
| CN | 114725160 A | 7/2022 |
| JP | 2003-051384 A | 2/2003 |
| JP | 2006-011391 A | 1/2006 |
| KR | 10-2015-0049571 A | 5/2015 |
| WO | WO-2007/111202 A1 | 10/2007 |

\* cited by examiner

PIXEL CIRCUIT, DRIVING CONTROL METHOD, DISPLAY SUBSTRATE AND DISPLAY DEVICE

CROSS-REFERENCE TO RELATED APPLICATIONS

The present application is the U.S. national phase of PCT Application No. PCT/CN2023/071907 filed on Jan. 12, 2023, the disclosure of which is hereby incorporated by reference in its entirety.

TECHNICAL FIELD

The present disclosure relates to the technical field of displaying, and more particularly, to a pixel circuit, a driving control method, a display substrate, and a display device.

BACKGROUND

In the related art, a transparent cathode sputter process is need when manufacturing a top-emission light-emitting device, such a sputter process is liable to generate particles (foreign bodies) between an anode of the top-emission light-emitting device and a cathode of the top-emission light-emitting device, resulting in high occurrence of dark spots in the display product.

SUMMARY

In an aspect, an embodiment of the present disclosure provides a pixel circuit, which includes a driving circuit, a control circuit and a light-emitting module.

A first end of the driving circuit is electrically connected to a power supply voltage line, a second end of the driving circuit is electrically connected to a first end of the light-emitting module, and the driving circuit is configured to generate a driving current for driving the light-emitting module under control of a potential of a control end of the driving circuit.

The control circuit is electrically connected to a first scanning line, the power supply voltage line and the second end of the driving circuit. The control circuit is configured to control a connection between the power supply voltage line and the second end of the driving circuit under control of a first scanning signal provided by the first scanning line.

A second end of the light-emitting module is electrically connected to a cathode voltage line.

Optionally, a width-to-length ratio of a transistor included in the control circuit is greater than a width-to-length ratio of a transistor included in the driving circuit.

Optionally, in at least one embodiment of the present disclosure, the pixel circuit further includes an energy storage circuit and a data writing circuit.

A first end of the energy storage circuit is electrically connected to the control end of the driving circuit, and a second end of the energy storage circuit is electrically connected to the first end of the light-emitting module. The energy storage circuit is configured to store electrical energy.

The data writing circuit is electrically connected to a second scanning line, a data line and the control end of the driving circuit. The data writing circuit is configured to write a data voltage provided by the data line into the control end of the driving circuit under control of a second scanning signal provided by the second scanning line.

Optionally, in at least one embodiment of the present disclosure, the pixel circuit further includes an external compensation control circuit.

The external compensation control circuit is electrically connected to the second scanning line, an external compensation line and the second end of the driving circuit. The external compensation control circuit is configured to control a connection between the external compensation line and the second end of the driving circuit under control of the second scanning signal.

Optionally, the light-emitting module includes at least two light-emitting elements; or, the light-emitting module includes one light-emitting element.

An anode of the light-emitting element is electrically connected to the first end of the light-emitting module, and a cathode of the light-emitting element is electrically connected to the cathode voltage line.

Optionally, the driving circuit includes a driving transistor, and the control circuit includes a first transistor.

A gate electrode of the driving transistor is electrically connected to the control end of the driving circuit, a first electrode of the driving transistor is electrically connected to the power supply voltage line, and a second electrode of the driving transistor is electrically connected to the first end of the light-emitting module.

A gate electrode of the first transistor is electrically connected to the first scanning line, a first electrode of the first transistor is electrically connected to the power supply voltage line, and a second electrode of the first transistor is electrically connected to the second end of the driving circuit.

Optionally, the energy storage circuit includes a storage capacitor, the external compensation control circuit includes a second transistor, and the data writing circuit includes a third transistor.

A first plate of the storage capacitor is electrically connected to the first end of the light-emitting module, and a second plate of the storage capacitor is electrically connected to the control end of the driving circuit.

A gate electrode of the second transistor is electrically connected to the second scanning line, a first electrode of the second transistor is electrically connected to the external compensation line, and a second electrode of the second transistor is electrically connected to the second end of the driving circuit.

A gate electrode of the third transistor is electrically connected to the second scanning line, a first electrode of the third transistor is electrically connected to the data line, and a second electrode of the third transistor is electrically connected to the control end of the driving circuit.

In a second aspect, an embodiment of the present disclosure provides a driving control method, applied to the above-described pixel circuit, the driving control method including:

providing a high-voltage signal by the cathode voltage line and providing a low-voltage signal by the power supply voltage line; or providing a low-voltage signal by the cathode voltage line and providing a high-voltage signal by the power supply voltage line; and writing, by the data writing circuit under control of the second scanning signal, the data voltage provided by the data line into the control end of the driving circuit so as to control the first end of the driving circuit to be disconnected from the second end of the driving circuit, and after the writing, controlling, by the control circuit under control of the first scanning signal, the power supply voltage line to be connected to the second end of the driving circuit.

In a third aspect, an embodiment of the present disclosure provides a display substrate, which includes a base substrate and a plurality of columns of pixel circuits disposed on the base substrate, each of which is the pixel circuit as described above.

Optionally, the pixel circuit includes a driving transistor, a first transistor, a second transistor and a third transistor.

An active layer pattern of the driving transistor, an active layer pattern of the first transistor, an active layer pattern of the second transistor and an active layer pattern of the third transistor are disposed in a same layer.

The active layer pattern of the third transistor and the active layer pattern of the driving transistor are arranged along a first direction.

The active layer pattern of the second transistor and the active layer pattern of the first transistor are arranged along the first direction.

The active layer pattern of the driving transistor and the active layer pattern of the first transistor are arranged along a second direction.

The first direction intersects with the second direction.

Optionally, the pixel circuit includes a storage capacitor.

A first plate of the storage capacitor includes a first plate portion and a second plate portion.

the first plate portion, a second plate of the storage capacitor and the second plate portion are disposed sequentially as a stack along a direction away from the base substrate, and the first plate portion is electrically connected to the second plate portion.

An orthographic projection of the first plate portion onto the base substrate, an orthographic projection of the second plate portion onto the base substrate and an orthographic projection of the second plate onto the base substrate at least partially overlap with each other.

Optionally, according to at least one embodiment of the present disclosure, the display substrate further includes an auxiliary cathode electrode line, the pixel circuit includes a light-emitting element; the auxiliary cathode electrode line is disposed on a first side of the pixel circuit.

The auxiliary cathode electrode line extends in a third direction, the third direction intersects with the first direction.

The auxiliary cathode electrode line is electrically connected to a cathode of the light-emitting element.

Optionally, the auxiliary cathode electrode line is electrically connected to an auxiliary connection pattern, and the auxiliary connection pattern and the auxiliary cathode electrode line are disposed in different layers.

Optionally, the auxiliary cathode electrode line is electrically connected to a first connection pattern.

The first connection pattern is electrically connected to a second connection pattern, and the first connection pattern and the second connection pattern are located in different layers. The second connection pattern and an anode of the light-emitting element are disposed in a same layer.

The second connection pattern is electrically connected to a third connection pattern, and the third connection pattern is disposed at a side of the second connection pattern away from the base substrate.

The third connection pattern is electrically connected to the cathode of the light-emitting element, and the cathode of the light-emitting element is disposed at a side of the third connection pattern away from the base substrate.

Optionally, an orthographic projection of the third connection pattern onto the base substrate is within an orthographic projection of the second connection pattern onto the base substrate.

Optionally, the pixel circuit includes a light-emitting element, the display substrate further includes a reflective electrode.

The reflective electrode is disposed between an anode of the light-emitting element and a cathode of the light-emitting element.

An orthographic projection of the reflective electrode onto the base substrate at least partially overlaps with an orthographic projection of the anode of the light-emitting element onto the base substrate. The reflective electrode is opaque, and the reflective electrode is electrically connected to the anode of the light-emitting element.

Optionally, according to at least one embodiment of the present disclosure, the display substrate further includes a light shielding pattern, where at least a portion of the light shielding pattern is disposed between the active layer pattern of the driving transistor and the base substrate, and the active layer pattern of the driving transistor and the active layer pattern of the first transistor are disposed in a same layer.

An orthographic projection of the active layer pattern of the driving transistor onto the base substrate at least partially overlaps with an orthographic projection of the light shielding pattern onto the base substrate.

An orthographic projection of the active layer pattern of the first transistor onto the base substrate at least partially overlaps with an orthographic projection of the light shielding pattern onto the base substrate.

Optionally, according to at least one embodiment of the present disclosure, the display substrate further includes the power supply voltage line and the data line.

The power supply voltage line is disposed at a second side of the pixel circuit; the data line is disposed at a first side of the pixel circuit.

The first side and the second side are opposite sides.

In a fourth aspect, an embodiment of the present disclosure provides a display device, including the display substrate as described above.

Optionally, the display substrate includes a plurality of columns of auxiliary cathode electrode lines and a plurality of rows of minimum repeating units and a plurality of columns of minimum repeating units disposed on the base substrate.

The minimum repeating unit includes at least three pixel circuits.

The at least three pixel circuits are respectively electrically connected to different data lines, respectively. The at least three pixel circuits are electrically connected to the power supply voltage line and the external compensation line. The at least three pixel circuits are electrically connected to the first scanning line and the second scanning line.

The auxiliary cathode electrode line, the data line, the power supply voltage line, and the external compensation line extend in a third direction, and a portion of the first scanning line and a portion of the second scanning line extend in a first direction, the first direction intersects with the third direction.

Optionally, the display substrate includes a pixel circuit region and a transparent region. The minimum repeating units are disposed in the pixel circuit region.

The transparent region is disposed at a first side of the pixel circuit region and a second side of the pixel circuit region.

The second scanning line is disposed at a third side of the transparent region, and the first scanning line is disposed gat a fourth side of the transparent region. The third side and the fourth side are opposite sides.

Optionally, the first scanning line includes at least two first scanning line portions extending in the first direction, and at least two second scanning line portions extending in the first direction.

The second scanning line includes at least two third scanning line portions extending in the first direction, and at least two fourth scanning line portions extending in the first direction.

An orthographic projection of the first scanning line portion onto the base substrate partially overlaps with an orthographic projection of the auxiliary cathode electrode line onto the base substrate, the orthographic projection of the first scanning line portion onto the base substrate partially overlaps with an orthographic projection of the data line onto the base substrate, and the orthographic projection of the first scanning line portion onto the base substrate partially overlaps with an orthographic projection of the external compensation line onto the base substrate.

An orthographic projection of the second scanning line portion onto the base substrate partially overlaps with an orthographic projection of the power supply voltage line onto the base substrate.

An orthographic projection of the third scanning line portion onto the base substrate partially overlaps with the orthographic projection of the auxiliary cathode electrode line onto the base substrate, the orthographic projection of the third scanning line portion onto the base substrate partially overlaps with the orthographic projection of the data line onto the base substrate, and the orthographic projection of the third scanning line portion onto the base substrate partially overlaps with the orthographic projection of the external compensation line onto the base substrate.

An orthographic projection of the fourth scanning line portion onto the base substrate partially overlaps with the orthographic projection of the power supply voltage line onto the base substrate.

BRIEF DESCRIPTION OF THE DRAWINGS

in FIG. 29, a box containing "X" denotes a via hole penetrating through the interlayer dielectric layer;

DETAILED DESCRIPTION

Embodiments of the present disclosure will now be described in details hereinafter with reference to the accompanying drawings, in which some, but not all embodiments of the disclosure are described. Based on the embodiments in the present disclosure, all other embodiments obtained by a person of ordinary skill in the art without creative effort fall within the scope of the present disclosure.

Transistors used in all the embodiments of the present disclosure may be thin film transistors or field effect transistors, or other devices with the same characteristics. In the embodiments of the present disclosure, to distinguish two electrodes of a transistor other than a gate electrode, one of the electrodes is referred to as a first electrode, and the other electrode is referred to as a second electrode.

In practical operation, when the transistor is a thin film transistor or a field effect transistor, the first electrode may be a drain electrode, and the second electrode may be a source electrode. Alternatively, the first electrode may be a source electrode, and the second electrode may be a drain electrode.

Figure 1:
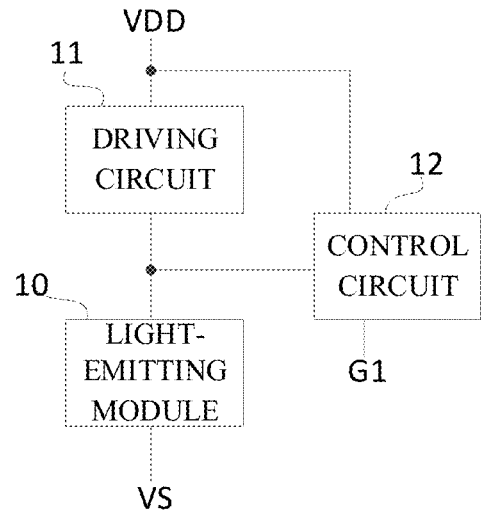
FIG. 1 is a structure diagram of a pixel circuit according to an embodiment of the present disclosure.

As shown in FIG. 1, according to an embodiment of the present disclosure, a pixel circuit includes a driving circuit 11, a control circuit 12 and a light-emitting module 10.

A first end of the driving circuit 11 is electrically connected to a power supply voltage line VDD, a second end of the driving circuit 11 is electrically connected to a first end of the light-emitting module 10, and the driving circuit 11 is configured to generate a driving current for driving the light-emitting module 10 under control of a potential of a control end of the driving circuit 11.

The control circuit 12 is electrically connected to the first scanning line G1, the power supply voltage line VDD and the second end of the driving circuit 11. The control circuit 12 is configured for controlling a connection between the power supply voltage line VDD and the second end of the driving circuit 11 under control of a first scanning signal provided by the first scanning line G1.

The second end of the light-emitting module 10 is electrically connected to the cathode voltage line VS.

In the pixel circuit according to the embodiment of the present disclosure, with the provision of the control circuit 12, a branch current can be increased by increasing the forward voltage and the reverse voltage, such that a particle (foreign body) at a dark spot can be burnt out and the dark spot can be changed into a normal pixel, so as to improve the product yield and displaying quality.

Optionally, a width-to-length ratio of a transistor included in the control circuit 12 is greater than a width-to-length ratio of a transistor included in the driving circuit 11.

In at least one embodiment of the present disclosure, the transistor included in the control circuit 12 may be a channel-enhanced TFT (a thin film transistor), the width-to-length ratio of which is designed to be greater, such that the current limitation on the TFT branch can be increased, and the branch current is enabled to be increased by increasing the forward voltage and the reverse voltage, thereby burning down the particle at the dark spot.

In at least one embodiment of the present disclosure, the pixel circuit further includes an energy storage circuit and a data writing circuit.

A first end of the energy storage circuit is electrically connected to the control end of the driving circuit, and a second end of the energy storage circuit is electrically connected to the first end of the light-emitting module; the energy storage circuit is configured to store electrical energy.

The data writing circuit is electrically connected to a second scanning line, the data line and the control end of the driving circuit. The data writing circuit is configured to write a data voltage provided by the data line into the control end of the driving circuit under control of a second scanning signal provided by the second scanning line.

In a specific implementation, the pixel circuit may further include the energy storage circuit and the data writing circuit, and the data writing circuit writes the data voltage provided by the data line into the control end of the driving circuit under control of the second scanning signal.

Optionally, the pixel circuit further includes an external compensation control circuit.

The external compensation control circuit is electrically connected to the second scanning line, an external compensation line and the second end of the driving circuit. The external compensation control circuit is configured to control a connection between the external compensation line and the second end of the driving circuit under control of the second scanning signal.

In a specific implementation, the pixel circuit according to at least one embodiment of the present disclosure may further include the external compensation control circuit which controls the connection between the external compensation line and the second end of the driving circuit under control of the second scanning signal.

Figure 2:
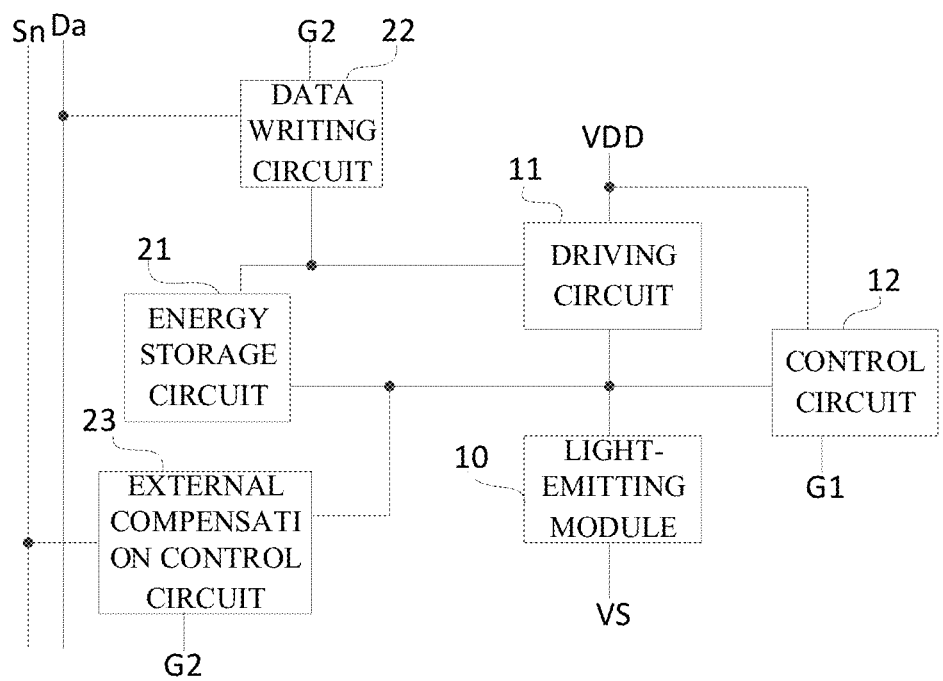
FIG. 2 is a structure diagram of a pixel circuit according to at least one embodiment of the present disclosure.

As shown in FIG. 2, on the basis of the embodiment of the driving circuit shown in FIG. 1, the driving circuit according to at least one embodiment of the present disclosure further includes an energy storage circuit 21, a data writing circuit 22 and an external compensation control circuit 23.

A first end of the energy storage circuit 21 is electrically connected to a control end of the driving circuit 11, and a second end of the energy storage circuit 21 is electrically connected to a first end of the light-emitting module 10; the energy storage circuit 21 is configured to store electric energy.

The data writing circuit 22 is electrically connected to a second scanning line G2, a data line Da and the control end of the driving circuit 11. The data writing circuit 22 is configured for writing a data voltage provided by the data line Da to the control end of the driving circuit 11 under control of a second scanning signal provided by the second scanning line G2.

The external compensation control circuit 23 is electrically connected to the second scanning line G2, an external compensation line Sn and the second end of the driving circuit 11. The external compensation control circuit 23 is configured for controlling a connection between the external compensation line Sn and the second end of the driving circuit 11 under control of the second scanning signal.

When the driving circuit according to at least one embodiment as shown in FIG. 2 of the present disclosure is in operation, the following operations are performed.

The cathode voltage line provides a high-voltage signal, and the power supply voltage line provides a low-voltage signal.

The data writing circuit writes the data voltage provided by the data line into the control end of the driving circuit under control of the second scanning signal, so as to control the first end of the driving circuit to be disconnected from the second end of the driving circuit. Afterwards, the control circuit controls the power supply voltage line to be connected to the second end of the driving circuit under control of the first scanning signal, so as to apply a reverse voltage to the light-emitting element included in the light-emitting module 10 to cause the particle at the light-emitting element to be burnt down.

Alternatively, when the driving circuit according to at least one embodiment as shown in FIG. 2 of the present disclosure is in operation, the following operations are performed.

The cathode voltage line provides a low-voltage signal, and he power supply voltage line provides a high-voltage signal.

The data writing circuit writes the data voltage provided by the data line into the control end of the driving circuit under control of the second scanning signal, so as to control the first end of the driving circuit to be disconnected from the second end of the driving circuit. Afterwards, the control circuit controls the power supply voltage line to be connected to the second end of the driving circuit under control of the first scanning signal, so as to apply a forward voltage to a light-emitting element included in the light-emitting module 10 to cause the particle at the light-emitting element to be burnt down.

Optionally, the light-emitting module includes at least two light-emitting elements; or, the light-emitting module includes one light-emitting element.

An anode of the light-emitting element is electrically connected to a first end of the light-emitting module, and a cathode of the light-emitting element is electrically connected to the cathode voltage line.

In at least one embodiment of the present disclosure, the light-emitting element may be, but is not limited to, a top-emission light-emitting element.

In specific implementation, the light-emitting element may be an organic light-emitting diode, but the present disclosure is not limited thereto.

Figure 3:
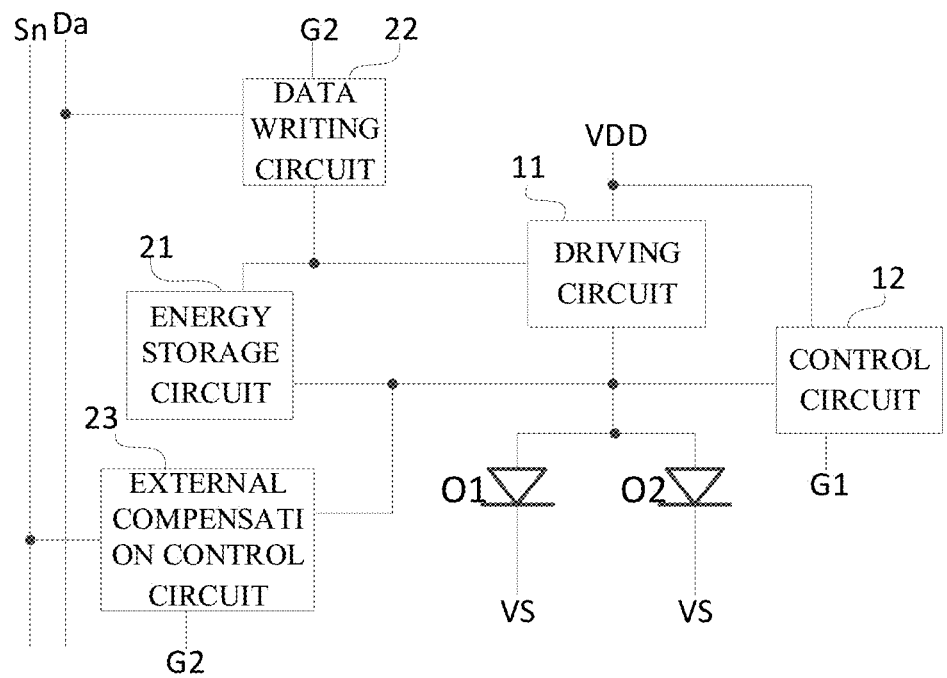
FIG. 3 is a structure diagram of a pixel circuit according to at least one embodiment of the present disclosure.

As shown in FIG. 3, on the basis of the pixel circuit according to at least one embodiment shown in FIG. 2, the light-emitting module includes a first organic light-emitting diode O1 and a second organic light-emitting diode O2.

An anode of the first organic light-emitting diode O1 is electrically connected to the second end of the driving circuit 11, and a cathode of the first organic light-emitting diode O1 is electrically connected to a cathode voltage line VS.

An anode of the second organic light emitting diode O2 is electrically connected to the second end of the driving circuit 11, and a cathode of the second organic light emitting diode O2 is electrically connected to the cathode voltage line VS.

Optionally, the driving circuit includes a driving transistor, and the control circuit includes a first transistor.

A gate electrode of the driving transistor is electrically connected to the control end of the driving circuit, a first electrode of the driving transistor is electrically connected to the power supply voltage line, and a second electrode of the driving transistor is electrically connected to the first end of the light-emitting module.

A gate electrode of the first transistor is electrically connected to the first scanning line, a first electrode of the first transistor is electrically connected to the power supply voltage line, and a second electrode of the first transistor is electrically connected to the second end of the driving circuit.

In at least one embodiment of the present disclosure, a width-to-length ratio of the first transistor is greater than a width-to-length ratio of the driving transistor.

Optionally, the energy storage circuit includes a storage capacitor, the external compensation control circuit includes a second transistor, and the data writing circuit includes a third transistor.

A first plate of the storage capacitor is electrically connected to the first end of the light-emitting module, and a second plate of the storage capacitor is electrically connected to the control end of the driving circuit.

A gate electrode of the second transistor is electrically connected to the second scanning line, a first electrode of the second transistor is electrically connected to the external compensation line, and a second electrode of the second transistor is electrically connected to the second end of the driving circuit.

A gate electrode of the third transistor is electrically connected to the second scanning line, a first electrode of the third transistor is electrically connected to the data line, and a second electrode of the third transistor is electrically connected to the control end of the driving circuit.

Figure 4:
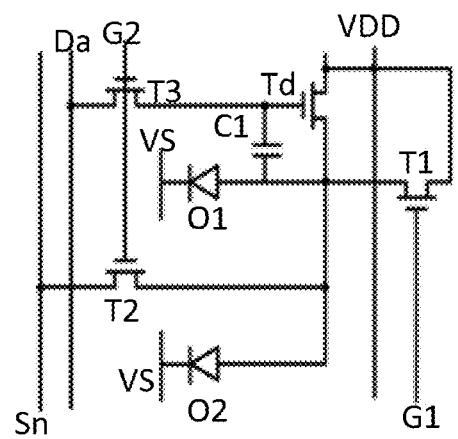
FIG. 4 is a circuit diagram of a pixel circuit according to at least one embodiment of the present disclosure.

As shown in FIG. 4, on the basis of the pixel circuit in at least one embodiment shown in FIG. 3, the driving circuit includes a driving transistor Td, and the control circuit includes a first transistor T1.

A first electrode of the driving transistor Td is electrically connected to the power supply voltage line VDD, and a second electrode of the driving transistor Td is electrically connected to an anode of the first organic light-emitting diode O1 and an anode of the second organic light-emitting diode O2.

A gate electrode of the first transistor T1 is electrically connected to a first scanning line G1, a first electrode of the first transistor T1 is electrically connected to the power supply voltage line VDD, and a second electrode of the first transistor T1 is electrically connected to a second electrode of the driving transistor Td.

The energy storage circuit includes a storage capacitor C1, the external compensation control circuit includes a second transistor T2, and the data writing circuit includes a third transistor T3.

A first plate of the storage capacitor C1 is electrically connected to the anode of the first organic light-emitting diode O1 and the anode of the second organic light-emitting diode O2, and a second plate of the storage capacitor C1 is electrically connected to a gate electrode of the driving transistor Td.

A gate electrode of the second transistor T2 is electrically connected to a second scanning line G2, a first electrode of the second transistor T2 is electrically connected to an external compensation line Sn, and a second electrode of the second transistor T2 is electrically connected to the second electrode of the driving transistor Td.

A gate electrode of the third transistor T3 is electrically connected to the second scanning line G2, a first electrode of the third transistor T3 is electrically connected to the data line Da, and a second electrode of the third transistor T3 is electrically connected to the gate electrode of the driving transistor Td.

In the pixel circuit of at least one embodiment shown in FIG. 4, the width-to-length ratio of T1 may be greater than the width-to-length ratio of Td.

In the pixel circuit of at least one embodiment shown in FIG. 4, all transistors are n-type transistors, but this is not limiting.

In a specific implementation, O1 and O2 may be applied with a reverse voltage, i.e., VS provides a high-voltage signal and VDD provides a low-voltage signal.

Firstly, G1 provides a high-voltage signal, G2 provides a high-voltage signal, T1, T2 and T3 are all switched on, Da provides a low-voltage signal to the gate electrode of Td, and Td is switched off.

Figure 5:
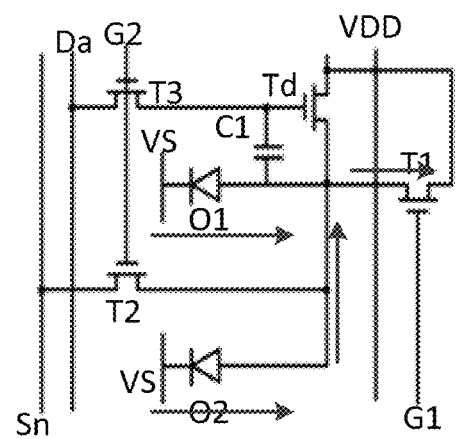
FIG. 5 is a schematic diagram of an operational state of the pixel circuit shown in FIG. 4 of the present disclosure according to at least one embodiment.

Then, G1 provides a high-voltage signal, G2 provides a low-voltage signal, T1 is switched on, T1 is a channel-enhanced TFT. As shown in FIG. 5, a current flows from the cathode of O1 to the anode of O1, a current flows from the cathode of O2 to the anode of O2, and the particle at the organic light-emitting diode is burned down by the applied reverse voltage.

In a specific implementation, O1 and O2 may be applied with a forward voltage, i.e., VS provides a low-voltage signal and VDD provides a high-voltage signal.

Firstly, G1 provides a high-voltage signal, G2 provides a high-voltage signal, T1, T2 and T3 are all switched on, Da provides a low-voltage signal to the gate electrode of Td, and Td is switched off.

Figure 6:
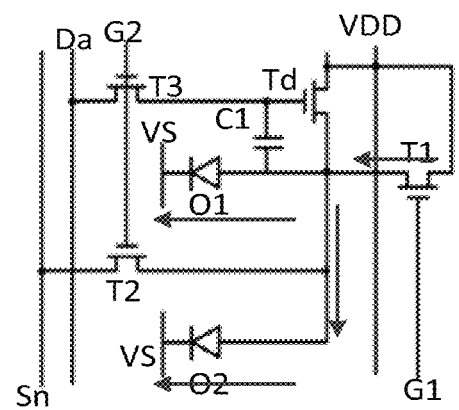
FIG. 6 is a schematic diagram of an operational state of the pixel circuit shown in FIG. 4 of the present disclosure according to at least one embodiment.

Then, G1 provides a high-voltage signal, G2 provides a low-voltage signal, T1 is switched on, T1 is a channel enhancement TFT. As shown in FIG. 6, a current flows from the anode of O1 to the cathode of O1, a current flows from an anode of O2 to the cathode of O2, and the particle at the organic light-emitting diode is burnt down by the applied forward voltage.

In the related art, the pixel circuit does not include a first transistor T1. Since the width-to-length ratio of Td, the width-to-length ratio of T2 and the width-to-length ratio of T3 are small, the limitation on the current is serious such that a larger current cannot be provided, and these transistors has a weak tolerance to the current. As such, in at least one embodiment of the present disclosure, the first transistor T1 is provided, and the first transistor T1 is a channel-enhanced TFT; which may increase a branch current, such that a dark spot can be changed to a normal spot, and an organic light-emitting diode can be protected from damage, the yield of a display product can be ensured, and the displaying quality can be improved.

Figure 7:
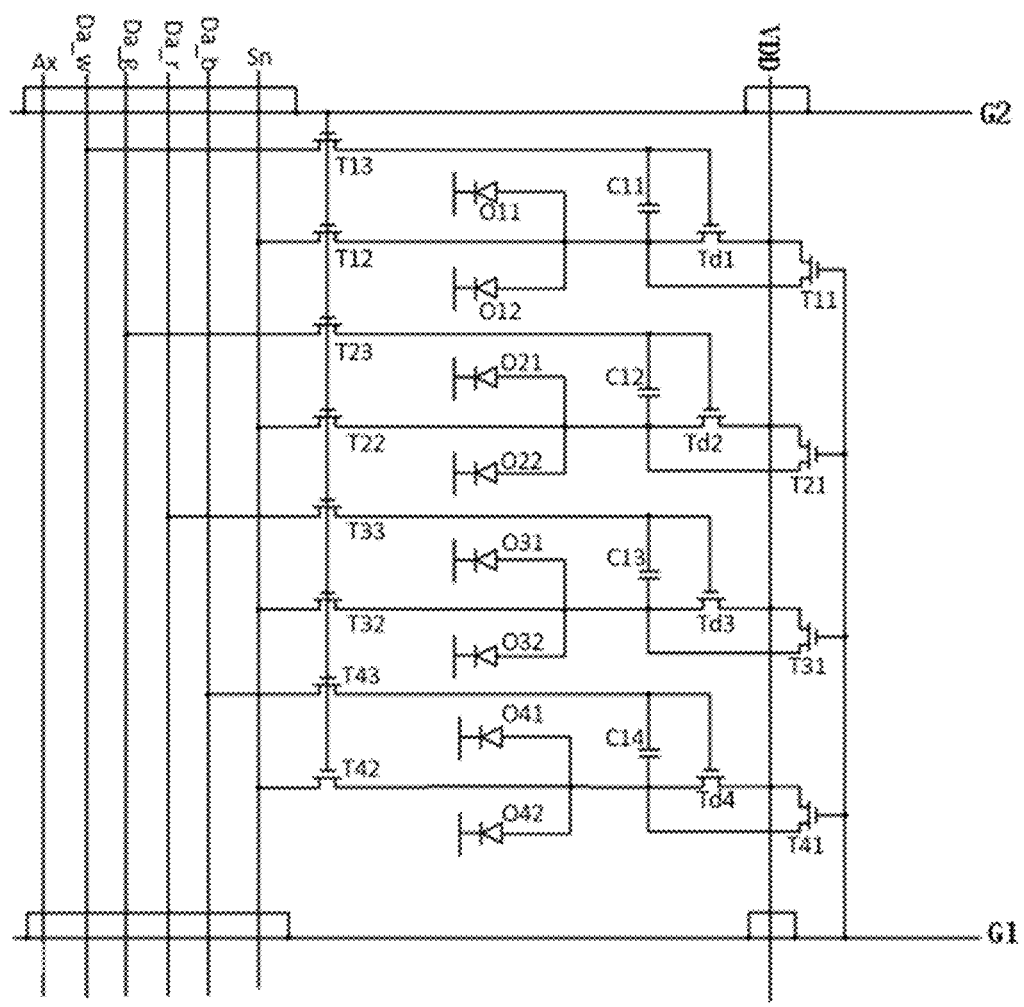
FIG. 7 is a circuit diagram for a minimum repeating unit included in a display substrate according to at least one embodiment.

FIG. 7 is a circuit diagram of a minimum repeating unit included in a display substrate according to at least one embodiment. The display substrate may include a plurality of rows and columns of minimum repeating units.

As shown in FIG. 7, the minimum repeating unit according to at least one embodiment may include a first pixel circuit, a second pixel circuit, a third pixel circuit and a fourth pixel circuit.

The first pixel circuit includes a first driving transistor Td1, a 1-st first transistor T11, a 1-st second transistor T12, a 1-st third transistor T13, a first storage capacitor C11, a first white organic light-emitting diode O11 and a second white organic light-emitting diode O12.

A first electrode of the first driving transistor Td1 is electrically connected to the power supply voltage line VDD, and a second electrode of the first driving transistor Td1 is electrically connected to an anode of the first white organic light-emitting diode O11 and an anode of the second white organic light-emitting diode O12.

A gate electrode of the 1-st first transistor T11 is electrically connected to a first scanning line G1, a first electrode of the 1-st first transistor T11 is electrically connected to a power supply voltage line VDD, and a second electrode of the 1-st first transistor T11 is electrically connected to the second electrode of the first driving transistor Td1.

A second plate of the first storage capacitor C11 is electrically connected to a gate electrode of the first driving transistor Td1, and a first plate of the first storage capacitor C11 is electrically connected to the anode of the first white organic light-emitting diode O11 and the anode of the second white organic light-emitting diode O12.

A gate electrode of the 1-st second transistor T12 is electrically connected to a second scanning line G2, a first electrode of the 1-st second transistor T12 is electrically connected to the external compensation line Sn, and a second electrode of the 1-st second transistor T12 is electrically connected to the second electrode of the first driving transistor Td1.

A gate electrode of the 1-st third transistor T13 is electrically connected to the second scanning line G2, a first electrode of the 1-st third transistor T13 is electrically connected to a white data line Da_w, and a second electrode of the 1-st third transistor T13 is electrically connected to the gate electrode of the first driving transistor Td1.

The second pixel circuit includes a second driving transistor Td2, a 2-nd first transistor T21, a 2-nd second transistor T22, a 2-nd third transistor T23, a second storage capacitor C12, a first green organic light-emitting diode O21 and a second green organic light-emitting diode O22.

A first electrode of the second driving transistor Td2 is electrically connected to the power supply voltage line VDD, and a second electrode of the second driving transistor Td2 is electrically connected to an anode of the first green organic light-emitting diode O21 and an anode of the second green organic light-emitting diode O22.

A gate electrode of the 2-nd first transistor T21 is electrically connected to the first scanning line G1, a first electrode of the 2-nd first transistor T21 is electrically connected to the power supply voltage line VDD, and a second electrode of the 2-nd first transistor T21 is electrically connected to the second electrode of the second driving transistor Td2;

A second plate of the second storage capacitor C12 is electrically connected to a gate electrode of the second driving transistor Td2, and a first plate of the second storage capacitor C12 is electrically connected to the anode of the first green organic light-emitting diode O21 and the anode of the second green organic light-emitting diode O22.

A gate electrode of the 2-nd second transistor T22 is electrically connected to the second scanning line G2, a first electrode of the 2-nd second transistor T22 is electrically connected to the external compensation line Sn, a second electrode of the 2-nd second transistor T22 is electrically connected to the second electrode of the second driving transistor Td2.

A gate electrode of the 2-nd third transistor T23 is electrically connected to the second scanning line G2, a first electrode of the 2-nd third transistor T23 is electrically connected to a green data line Da_g, and a second electrode of the 2-nd third transistor T23 is electrically connected to the gate electrode of the second driving transistor Td2.

The third pixel circuit includes a third driving transistor Td3, a 3-rd first transistor T31, a 3-rd second transistor T32, a 3-rd third transistor T33, a third storage capacitor C13, a first red organic light-emitting diode O31 and a second red organic light-emitting diode O32.

A first electrode of the third driving transistor Td3 is electrically connected to the power supply voltage line VDD, and a second electrode of the third driving transistor Td3 is electrically connected to an anode of the first red organic light-emitting diode O31 and an anode of the second red organic light-emitting diode O32.

A gate electrode of the 3-rd first transistor T31 is electrically connected to a first scanning line G1, a first electrode of the 3-rd first transistor T31 is electrically connected to the power supply voltage line VDD, and a second electrode of the 3-rd first transistor T31 is electrically connected to the second electrode of the third driving transistor Td3.

A second plate of the third storage capacitor C13 is electrically connected to a gate electrode of the third driving transistor Td3, and a first plate of the third storage capacitor C13 is electrically connected to the anode of the first red organic light-emitting diode O31 and the anode of the second red organic light-emitting diode O32.

A gate electrode of the 3-rd second transistor T32 is electrically connected to the second scanning line G2, a first electrode of the 3-rd second transistor T32 is electrically connected to the external compensation line Sn, and a second electrode of the 3-rd second transistor T32 is electrically connected to the second electrode of the third driving transistor Td3.

A gate electrode of the third and third transistor T33 is electrically connected to the second scanning line G2, a first electrode of the third and third transistor T33 is electrically connected to a red data line Da_r, and a second electrode of the third and third transistor T33 is electrically connected to the gate electrode of the third driving transistor Td3.

The fourth pixel circuit includes a fourth driving transistor Td4, a 4-th first transistor T41, a 4-th second transistor T42, a 4-th third transistor T43, a fourth storage capacitor C14, a first blue organic light-emitting diode O41 and a second blue organic light-emitting diode O42.

A first electrode of the fourth driving transistor Td4 is electrically connected to the power supply voltage line VDD, and a second electrode of the fourth driving transistor Td4 is electrically connected to an anode of the first blue organic light-emitting diode O41 and an anode of the second blue organic light-emitting diode O42.

A gate electrode of the 4-th first transistor T41 is electrically connected to the first scanning line G1, a first electrode of the 4-th first transistor T41 is electrically connected to the power supply voltage line VDD, and a second electrode of the 4-th first transistor T41 is electrically connected to the second electrode of the fourth driving transistor Td4.

A second plate of the fourth storage capacitor C14 is electrically connected to a gate electrode of the fourth driving transistor Td4, and a first plate of the fourth storage capacitor C14 is electrically connected to the anode of the first blue organic light-emitting diode O41 and the anode of the second blue organic light-emitting diode O42.

A gate electrode of the 4-th second transistor T42 is electrically connected to the second scanning line G2, a first electrode of the 4-th second transistor T42 is electrically connected to the external compensation line Sn, and a second electrode of the 4-th second transistor T42 is electrically connected to the second electrode of the fourth driving transistor Td4.

A gate electrode of the 4-th third transistor T43 is electrically connected to the second scanning line G2, a first electrode of the 4-th third transistor T43 is electrically connected to a blue data line Da_b, and a second electrode of the 4-th third transistor T43 is electrically connected to the gate electrode of the fourth driving transistor Td4.

In at least one embodiment shown in FIG. 7, all transistors are n-type transistors, but this is not limiting.

In at least one embodiment shown in FIG. 7, the external compensation line Sn, the white data line Da_w, the green data line Da_g, the red data line Da_r and the blue data line Da_b are all disposed on the left side of each pixel circuit, and the external compensation line Sn, the white data line Da_w, the green data line Da_g, the red data line Da_r and the blue data line Da_b all extend in a vertical direction.

The power supply voltage line VDD extends in the vertical direction, and the power supply voltage line VDD may be disposed on the right side of each pixel circuit.

The first scanning line G1 is disposed below each pixel circuit, and most of the first scanning line G1 extends in a horizontal direction.

The second scanning line G2 is disposed above each pixel circuit, and most of the second scanning line G2 extends in the horizontal direction.

An auxiliary cathode electrode line Ax extends in the vertical direction, and may be disposed at the left side of each pixel circuit.

In at least one embodiment shown in FIG. 7, the white pixel circuit, the green pixel circuit, the red pixel circuit, and the blue pixel circuit are sequentially arranged along the vertical direction.

In at least one embodiment of the present disclosure, the minimum repeating unit may include at least three pixel circuits, the at least three pixel circuits are pixel circuits having different colors.

In a specific implementation, when the minimum repeating unit includes a first pixel circuit, a second pixel circuit, a third pixel circuit and a fourth pixel circuit, the first pixel circuit, the second pixel circuit, the third pixel circuit and the fourth pixel circuit may be arranged along the vertical direction in the sequence listed. The first pixel circuit may be one of the red pixel circuit, the green pixel circuit, the blue pixel circuit and the white pixel circuit; the second pixel circuit may be one of the red pixel circuit, the green pixel circuit, the blue pixel circuit and the white pixel circuit; the third pixel circuit may be a red pixel circuit and a green pixel circuit, one of a blue pixel circuit and a white pixel circuit; and the fourth pixel circuit may be one of the red pixel circuit, the green pixel circuit, the blue pixel circuit and the white pixel circuit. A color corresponding to the first pixel circuit, a color corresponding to the second pixel circuit, a color corresponding to the third pixel circuit and a color corresponding to the fourth pixel circuit are different from each other.

When the minimum repeating unit includes the first pixel circuit, a second pixel circuit and a third pixel circuit, the first pixel circuit, the second pixel circuit and the third pixel circuit may be arranged along the vertical direction in the sequence listed. The first pixel circuit may be one of the red pixel circuit, the green pixel circuit and the blue pixel circuit. The second pixel circuit may be one of the red pixel circuit, the green pixel circuit and the blue pixel circuit. The third pixel circuit may be one of the red pixel circuit, the green pixel circuit and the blue pixel circuit. A color corresponding to the first pixel circuit, a color corresponding to the second pixel circuit and a color corresponding to the third pixel circuit are different from each other.

According to an embodiment of the present disclosure, a driving control method, applied to the above-described pixel circuit, includes:

providing, by the cathode voltage line, a high-voltage signal and providing, by the power supply voltage line, a low-voltage signal; or providing, by the cathode voltage line, a low-voltage signal and providing, by the power supply voltage line, a high-voltage signal;

writing, by the data writing circuit, the first voltage signal provided by the data line into the control end of the driving circuit under control of the second scanning signal so as to control the first end of the driving circuit to be disconnected from the second end of the driving circuit, and then controlling, by the control circuit, the power supply voltage line to be connected to the second end of the driving circuit under control of the first scanning signal.

According to an embodiment of the present disclosure, a display substrate includes a base substrate and a plurality of rows pixel circuits and a plurality of columns of pixel circuits disposed on the base substrate, each pixel circuit of which is the pixel circuit as described above.

Optionally, the pixel circuit includes a driving transistor, a first transistor, a second transistor and a third transistor.

An active layer pattern of the driving transistor, an active layer pattern of the first transistor, an active layer pattern of the second transistor and an active layer pattern of the third transistor are disposed in a same layer.

The active layer pattern of the third transistor and the active layer pattern of the driving transistor are arranged along a first direction.

The active layer pattern of the second transistor and the active layer pattern of the first transistor are arranged along the first direction.

The active layer pattern of the driving transistor and the active layer pattern of the first transistor are arranged along a second direction.

The first direction intersects with the second direction.

Figure 8:
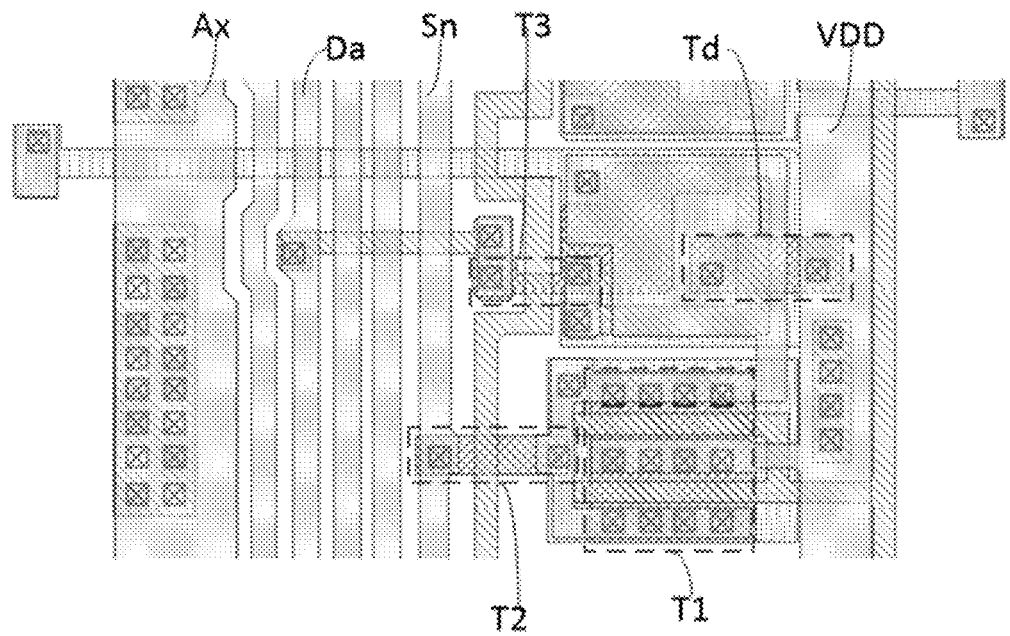
FIG. 8 is a layout diagram of a portion of the pixel circuit shown in FIG. 4 of the present disclosure according to at least one embodiment.
Figure 9:
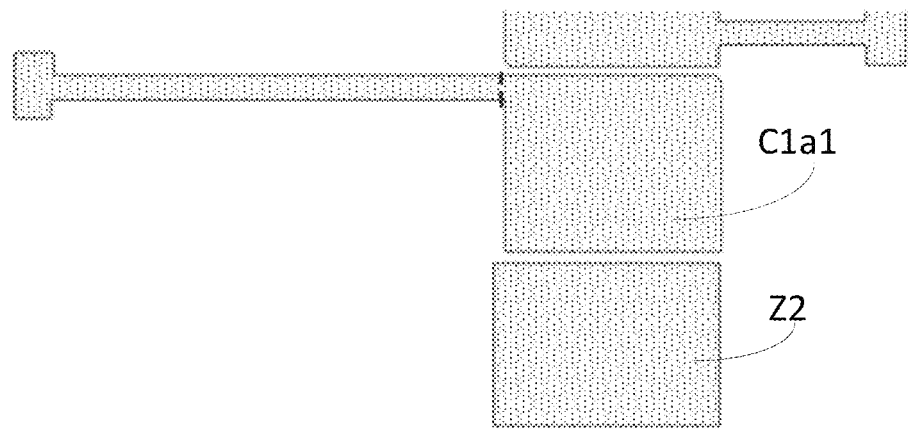
FIG. 9 is a layout diagram of a light-shielding layer in FIG. 8.
Figure 10:
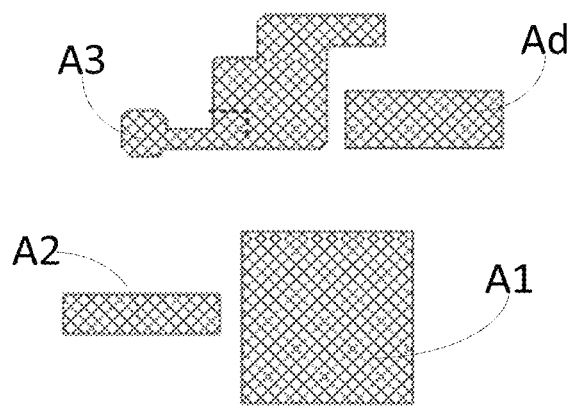
FIGS. 10 and 11 are layout diagrams of a semiconductor layer in FIG. 8.
Figure 11:
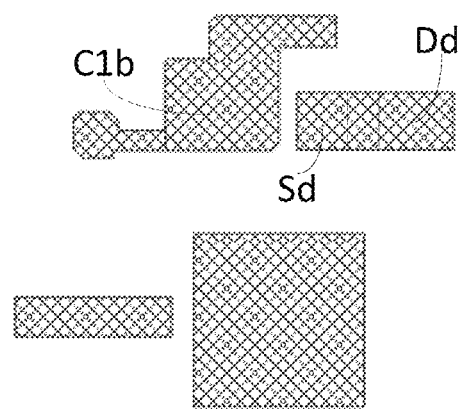
Figure 12:
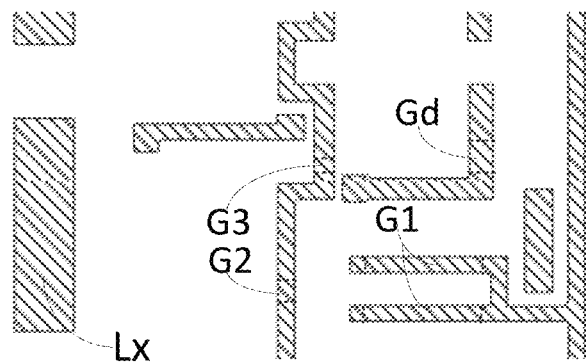
FIG. 12 is a layout diagram of a gate metal layer in FIG. 8.
Figure 13:
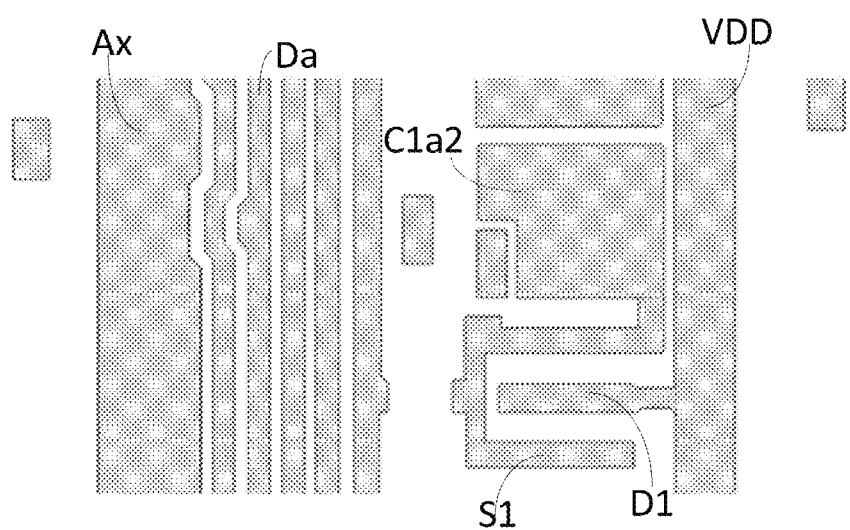
FIG. 13 is a layout diagram of a source and drain metal layer in FIG. 8.

FIG. 8 is a layout diagram of a portion of the pixel circuit as shown in FIG. 4 of the present disclosure according to at least one embodiment; FIG. 9 is a layout diagram of the light-shielding layer in FIG. 8, FIGS. 10 and 11 are layout diagrams of a semiconductor layer in FIG. 8; FIG. 12 is a layout diagram of a gate metal layer in FIG. 8; and FIG. 13 is a layout diagram of a source and drain metal layer in FIG. 8.

In FIG. 8, reference sign Td denotes a driving transistor, reference sign T1 denotes a first transistor, reference sign T2 denotes a second transistor, reference sign T3 denotes a third transistor, reference sign Ax denotes an auxiliary cathode electrode line, reference sign Da denotes a data line, reference sign Sn denotes an external compensation line, and reference sign VDD denotes a power supply voltage line.

Figure 14:
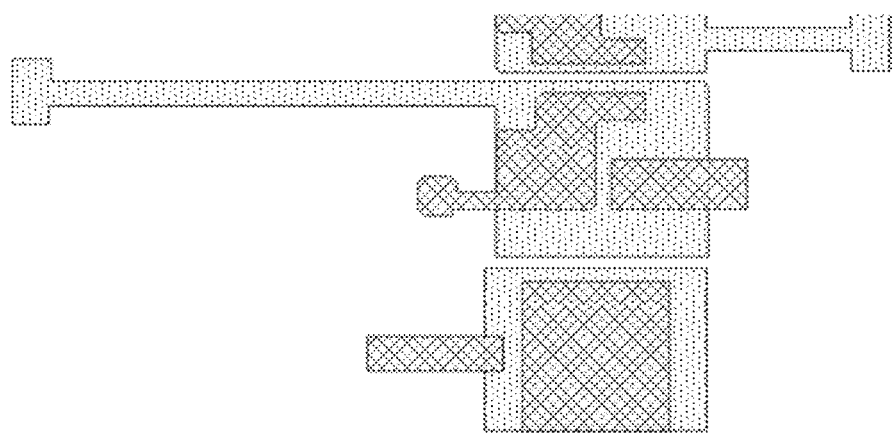
FIG. 14 is a diagram of a stack of the light-shielding layer and the semiconductor layer in FIG. 8.
Figure 15:
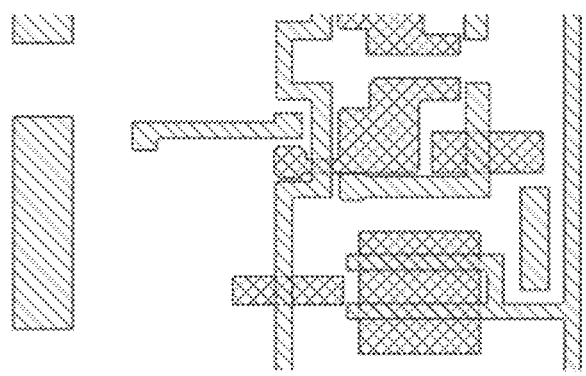
FIG. 15 is a diagram of a stack of the semiconductor layer and the gate metal layer in FIG. 8.
Figure 16:
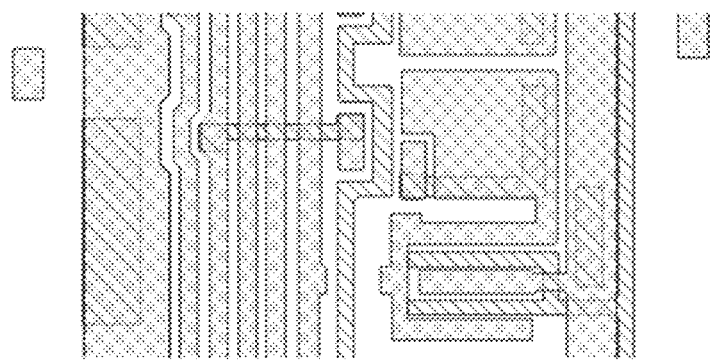
FIG. 16 is a diagram of a stack of the gate metal layer and the source and drain metal layer in FIG. 14.

FIG. 14 is a diagram showing stacked layers including the light-shielding layer and the semiconductor layer in FIG. 8; FIG. 15 is a diagram showing stacked layers including the semiconductor layer and the gate metal layer in FIG. 8; and FIG. 16 is a diagram showing stacked layers including the gate metal layer and the source and drain metal layer in FIG. 14.

Figure 17:
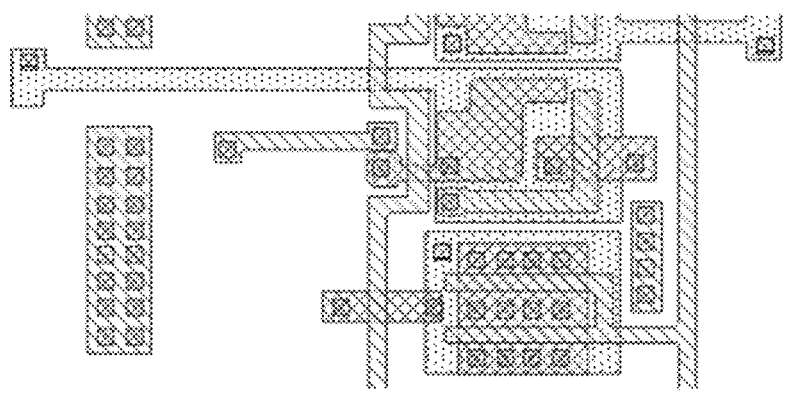
FIG. 17 is a schematic diagram showing via holes penetrating through an interlayer dielectric layer in the stack of the light-shielding layer, the semiconductor layer and the gate metal layer in FIG. 8.

FIG. 17 is a schematic diagram showing via holes penetrating through an interlayer dielectric layer provided in a diagram of stacked layers including the light-shielding layer, the semiconductor layer and the gate metal layer in FIG. 8. In FIG. 17, a reference sign, a box containing "X", denotes a via hole penetrating through the interlayer dielectric layer.

In a specific implementation, a light shielding pattern formed in the light-shielding layer needs to be electrically connected with a pattern formed in the source and drain metal layer, and a thickness of an insulating layer between the light-shielding layer and the source and drain metal layer is relatively large, so that holes can be punched in the form of a sleeve holes, and a method of punching twice can be used to form via holes for electrically connecting the light shielding pattern formed in the light-shielding layer with the pattern formed in the source and drain metal layer.

In FIG. 10, reference sign Ad denotes an active layer pattern of the driving transistor Td, reference sign A1 denotes an active layer pattern of the first transistor T1, reference sign A2 denotes an active layer pattern of the second transistor T2, and reference sign A3 denotes an active layer pattern of the third transistor T3.

As shown in FIG. 10, the active layer pattern Ad of the driving transistor Td, the active layer pattern A1 of the first transistor T1, the active layer pattern A2 of the second transistor T2 and the active layer pattern A3 of the third transistor T3 are disposed in the same layer.

A3 and Ad are arranged along the horizontal direction.

A2 and A1 are arranged along the horizontal direction.

Ad and A1 are arranged along the vertical direction.

In at least one embodiment of the present disclosure, the first direction may be the horizontal direction and the second direction may be the vertical direction, but the present disclosure is not limited thereto.

In at least one embodiment of the present disclosure, the pixel circuit includes a storage capacitor.

A first plate of the storage capacitor includes a first plate portion and a second plate portion.

The first plate portion, a second plate of the storage capacitor and the second plate portion are sequentially disposed in a stack in a direction away from the base substrate, and the first plate portion is electrically connected to the second plate portion.

An orthographic projection of the first plate portion onto the base substrate, an orthographic projection of the second plate portion onto the base substrate and an orthographic projection of the second plate onto the base substrate at least partially overlap with each other.

In a specific implementation, the first plate of the storage capacitor includes the first plate portion and the second plate portion which are electrically connected to each other, the first plate portion, the second plate of the storage capacitor and the second plate portion are stacked on one another in a direction away from the base substrate, the orthographic projection of the first plate portion onto the base substrate, the orthographic projection of the second plate portion onto the base substrate and the orthographic projection of the second plate onto the base substrate at least partially overlap with each other, such that the capacitance value of the storage capacitor can be improved.

In FIG. 9, reference sign C1a1 denotes a first plate portion included by a first plate of a storage capacitor, and in FIG. 11, reference sign C1b denotes a second plate of the storage capacitor.

In FIG. 13, reference sign C1a2 denotes a second plate portion included in the first plate of the storage capacitor.

As shown in FIG. 8, the orthographic projection of C1a1 onto the base substrate, the orthographic projection of C1b onto the base substrate and the orthographic projection of C1a2 onto the base substrate at least partially overlap with each other.

As shown in FIGS. 8 to 17, C1a1 is electrically connected to C1b1 through via hole.

In FIG. 11, reference sign Dd denotes a first electrode of Td, and reference sign Sd denotes a second electrode of Td.

As shown in FIGS. 8 to 17, Dd is electrically connected to the power supply voltage line VDD through via hole, Sd is electrically connected to C1b through via hole, and C1a1 is electrically connected to the second electrode Sd of Td.

In at least one embodiment shown in FIG. 8, the first plate portion C1a1 included in the first plate of a storage capacitor is formed in the light-shielding layer, the second plate C1b of the storage capacitor is formed in the semiconductor layer, the second plate portion C1a2 included in the first plate of the storage capacitor is formed in the source and drain metal layer, at least a portion of C1b is disposed between C1a1 and C1a2, and C1a1 and C1b1 are electrically connected. In this way, the capacitance value of the storage capacitor can be improved.

According to at least one embodiment of the present disclosure, the display substrate further includes an auxiliary cathode electrode line, the pixel circuit includes a light-emitting element, and the auxiliary cathode electrode line is disposed at a first side of the pixel circuit.

The auxiliary cathode electrode line extends in a third direction, the third direction intersects with the first direction.

The auxiliary cathode electrode line is electrically connected to the cathode of the light-emitting element.

Alternatively, the first direction may be a horizontal direction and the third direction may be a vertical direction, but the present disclosure is not limited thereto.

As shown in FIG. 8, an auxiliary cathode electrode line Ax extends in the vertical direction, and the auxiliary cathode electrode line Ax is provided at the left side of the pixel circuit, the pixel circuit including a driving transistor Td, a first transistor T1, a second transistor T2, a third transistor T3, and a storage capacitor.

In at least one embodiment shown in FIG. 8, the first side is the left side.

In at least one embodiment of the present disclosure, the auxiliary cathode electrode line is electrically connected to an auxiliary connection pattern, the auxiliary connection pattern and the auxiliary cathode electrode line are disposed in different layers.

As shown in FIG. 13, the auxiliary cathode electrode line Ax may be formed in the source and drain metal layer. As shown in FIG. 12, an auxiliary connection pattern Lx is formed in the gate metal layer, and the auxiliary cathode electrode line Ax and the auxiliary connection pattern Lx are electrically connected through via hole, such that a resistance of the auxiliary cathode electrode line Ax is reduced.

In at least one embodiment of the present disclosure, the auxiliary cathode electrode line Ax is electrically connected to a cathode layer, where the cathode of the light-emitting element is formed in the cathode layer.

In a specific implementation, the light-emitting element may be a top emission light-emitting element, the cathode of the light-emitting element is a transparent cathode, and since a resistance of the transparent cathode is larger. In order to reduce the resistance of the cathode of the light-emitting element, in at least one embodiment of the present disclosure, the cathode layer is arranged to be electrically connected to the auxiliary cathode electrode line Ax, and the auxiliary cathode electrode line Ax is arranged to be electrically connected to the auxiliary connection pattern Lx, such that the resistance of the cathode of the light-emitting element is reduced.

According to at least one embodiment of the present disclosure, the display substrate further includes a light shielding pattern, at least a portion of the light shielding pattern is arranged between the active layer pattern of the driving transistor and the base substrate, and the active layer pattern of the driving transistor is disposed in the same layer as the active layer pattern of the first transistor.

An orthographic projection of the active layer pattern of the driving transistor onto the base substrate at least partially overlaps with an orthographic projection of the light shielding pattern onto the base substrate.

An orthographic projection of the active layer pattern of the first transistor onto the base substrate at least partially overlaps with the orthographic projection of the light shielding pattern onto the base substrate.

As shown in FIG. 9, C1a1 is reused as a first light shielding pattern and a structure with a reference sign Z2 is a second light shielding pattern.

As shown in FIG. 10, the active layer pattern Ad of the driving transistor and the active layer pattern A1 of the first transistor T1 are formed in the semiconductor layer.

As shown in FIGS. 8 to 17, an orthographic projection of the active layer pattern Ad of the driving transistor onto the base substrate at least partially overlaps with an orthographic projection of C1a1 onto the base substrate, such that the light incident on the active layer pattern Ad of the driving transistor is reduced and the threshold voltage shift phenomenon of the driving transistor can be improved.

As shown in FIGS. 8 to 17, an orthographic projection of the active layer pattern A1 of the first transistor onto the base substrate at least partially overlaps with an orthographic projection of the Z2 onto the base substrate, such that the light incident on the active layer pattern A1 of the first transistor is reduced and the threshold voltage shift phenomenon of the first transistor can be reduced.

Alternatively, the light-shielding layer may be a metal layer, example, the light-shielding layer may be made of Mo (molybdenum), but the present disclosure is not limited thereto.

In at least one embodiment of the present disclosure, the display substrate may further include a power supply voltage line and a data line.

The power supply voltage line is disposed at a second side of the pixel circuit; the data line is disposed at a first side of the pixel circuit.

The first side and the second side are opposite sides.

As shown in FIGS. 8 and 13, reference sign VDD denotes a power supply voltage line, and reference sign Da denotes a data line.

The power supply voltage line VDD is disposed at the right side of the pixel circuit, and the data line Da is disposed at the left side of the pixel circuit.

In at least one embodiment shown in FIG. 8, the first side may be the left side and the second side may be the right side.

In FIG. 12, reference sign G1 denotes a gate electrode of T1, reference sign G2 denotes a gate electrode of T2, reference sign G3 denotes a gate electrode of T3, and reference sign Gd denotes a gate electrode of Td.

In FIG. 13, reference sign D1 denotes a first electrode of T1, and reference sign S1 denotes a second electrode of T1.

Figure 18:
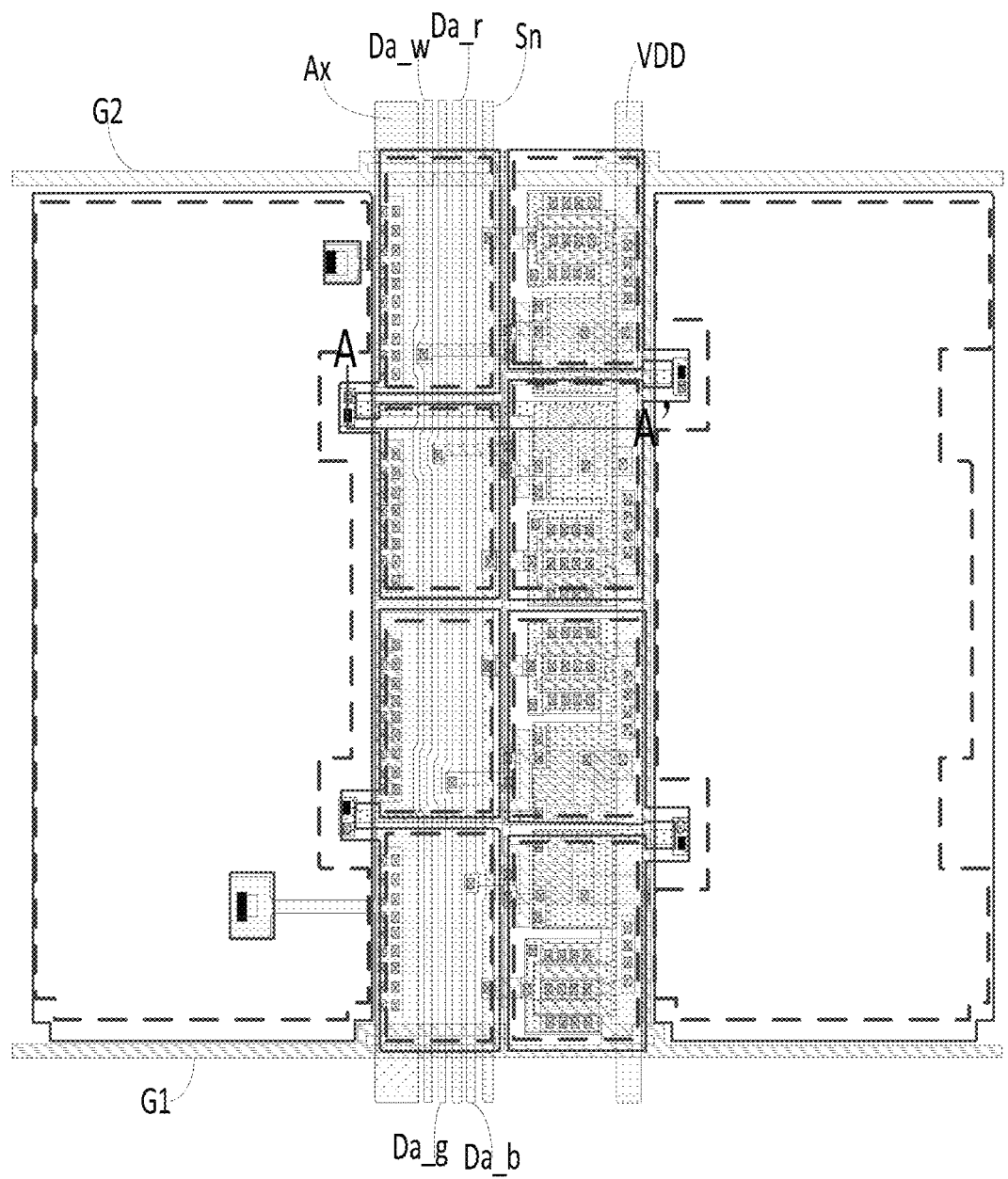
FIG. 18 is a layout diagram of the minimum repeating unit shown in FIG. 7 according to at least one embodiment.

FIG. 18 is a layout diagram of the minimum repeating unit shown in FIG. 7 according to at least one embodiment.

In FIG. 18, a pixel definition layer is provided outside the dashed box, and a first insulating layer is provided outside the solid line frame. The first insulating layer may be, for example, a resin layer.

Figure 19:
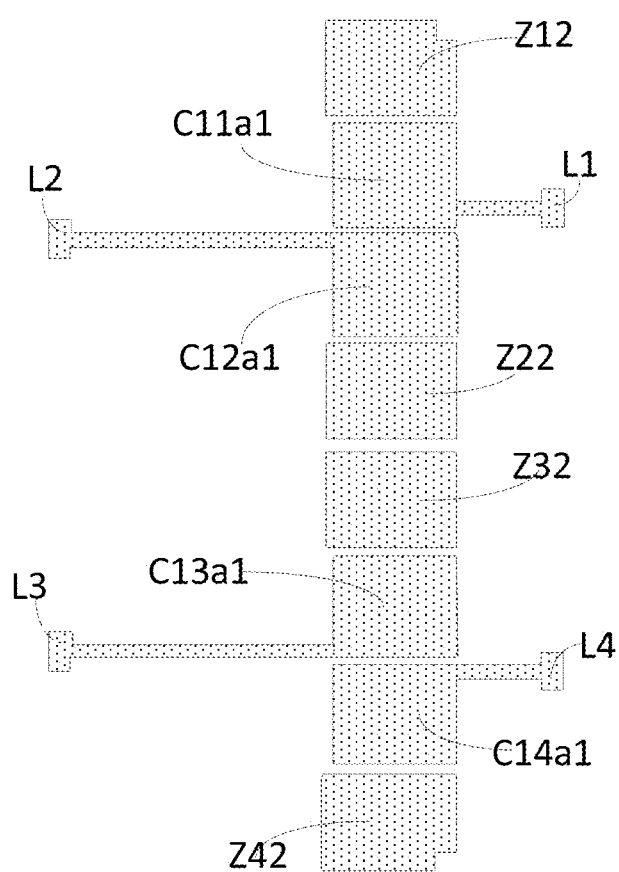
FIG. 19 is a layout diagram of a light-shielding layer in FIG. 18.
Figure 20:
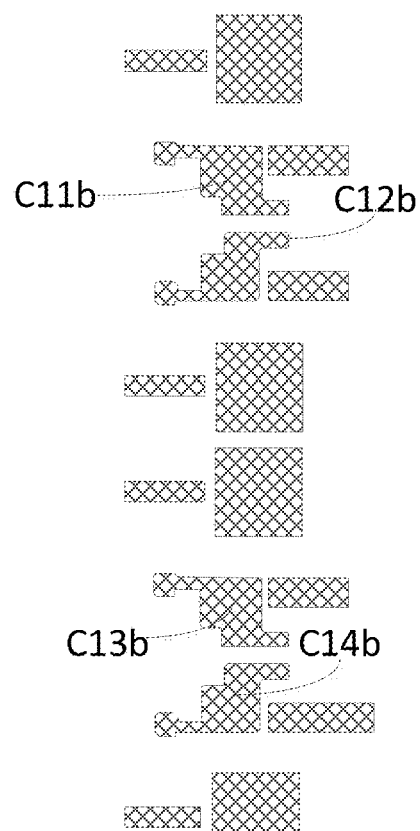
FIG. 20 is a layout diagram of a semiconductor layer in FIG. 18.
Figure 21:
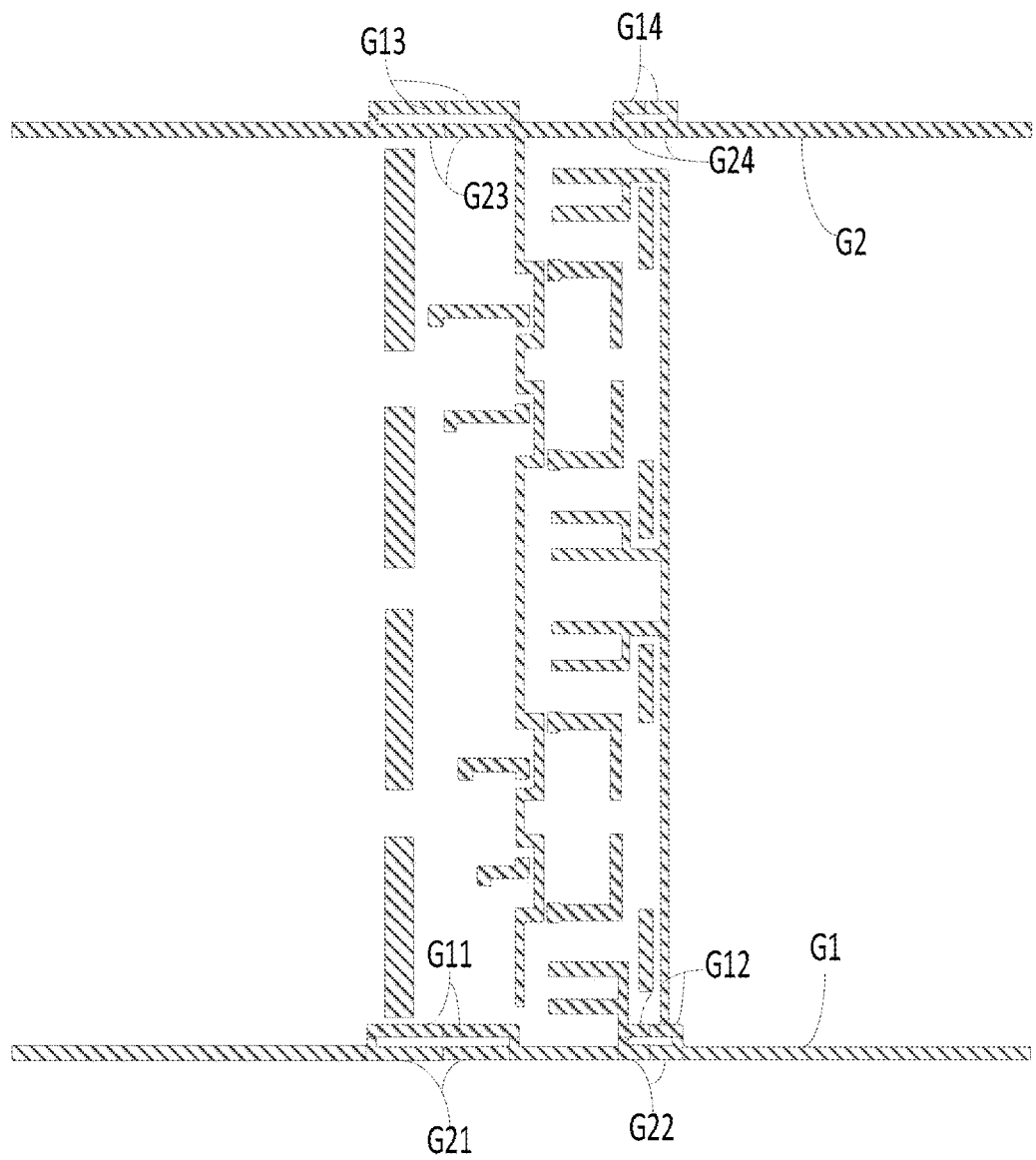
FIG. 21 is a layout diagram of a gate metal layer in FIG. 18.
Figure 22:
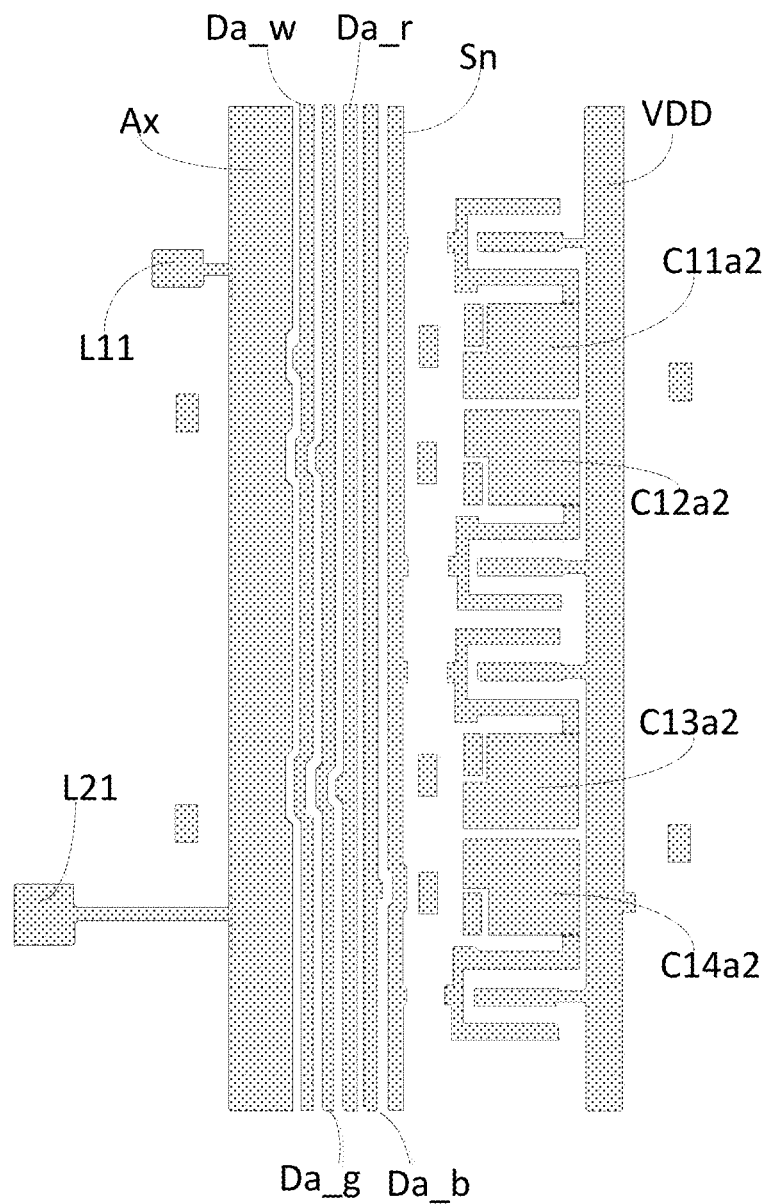
FIG. 22 is a layout diagram of a source and drain metal layer in FIG. 18.

FIG. 19 is a layout diagram of a light-shielding layer in FIG. 18, FIG. 20 is a layout diagram of a semiconductor layer in FIG. 18, FIG. 21 is a layout diagram of a gate metal layer in FIG. 18, FIG. 22 is a layout diagram of a source and drain metal layer in FIG. 18.

Figure 23:
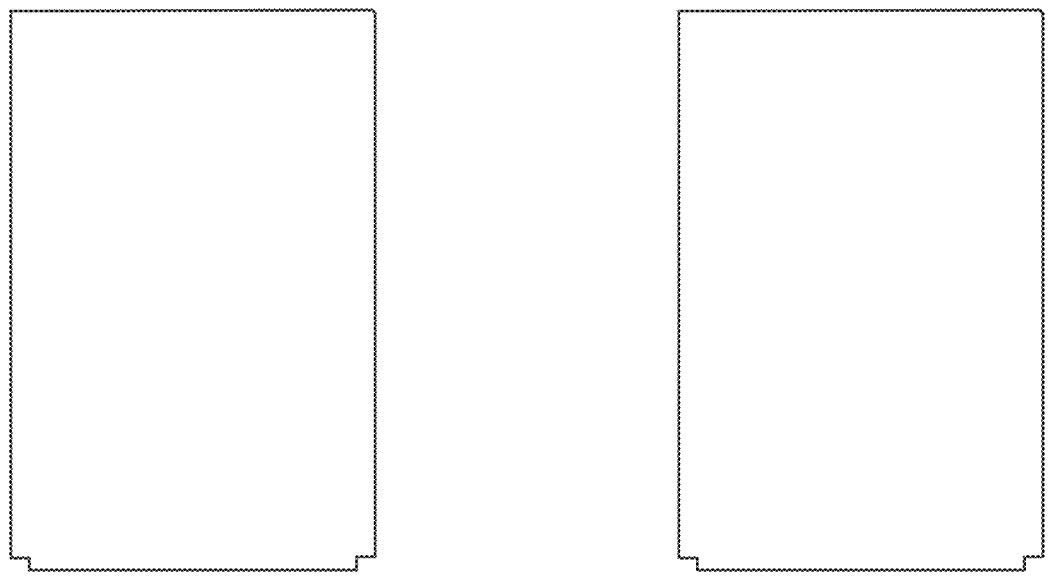
FIG. 23 is a solid line frame in FIG. 18.

FIG. 23 is a solid line frame in FIG. 18, the first insulating layer is provided outside the solid line frame, and the first insulating layer is not provided inside the solid line frame.

Figure 24:
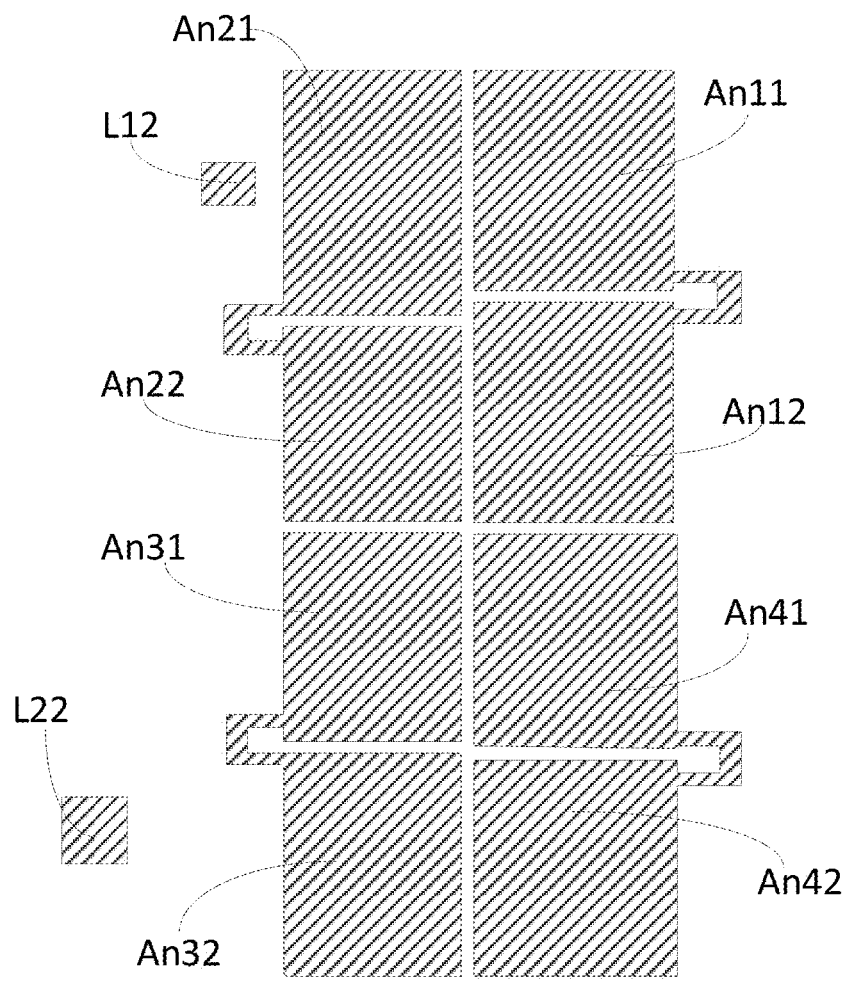
FIG. 24 is a layout diagram of an anode layer in FIG. 18.
Figure 25:
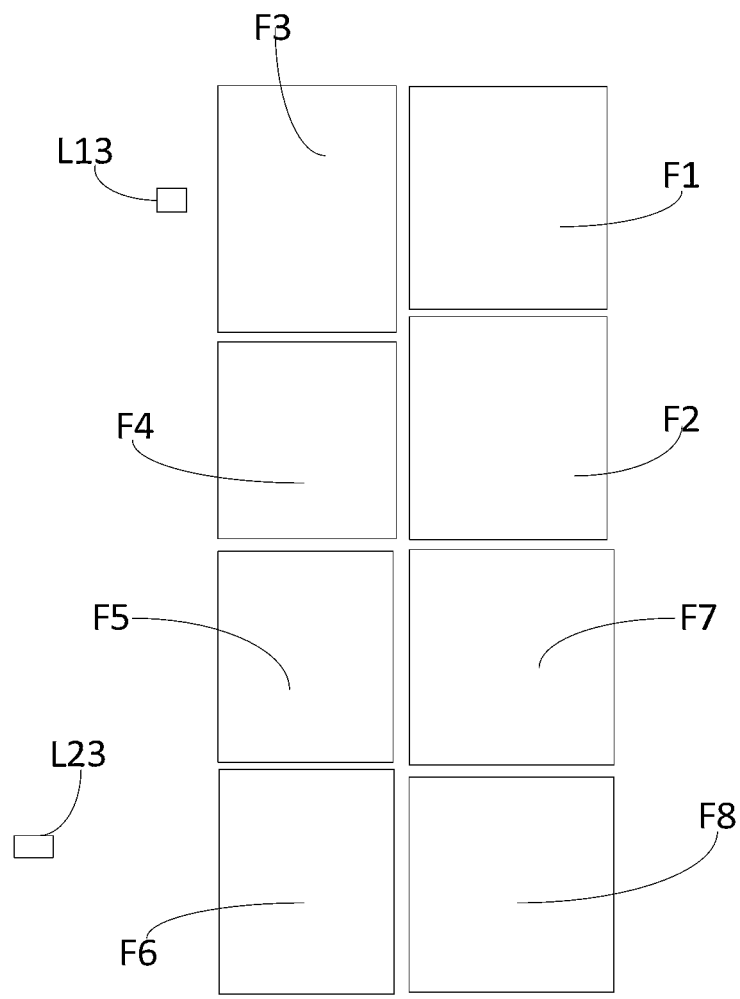
FIG. 25 is a layout diagram of an electrode layer in FIG. 18.

FIG. 24 is a layout diagram of an anode layer in FIG. 18; FIG. 25 is a layout diagram of an electrode layer in FIG. 18.

Figure 26:
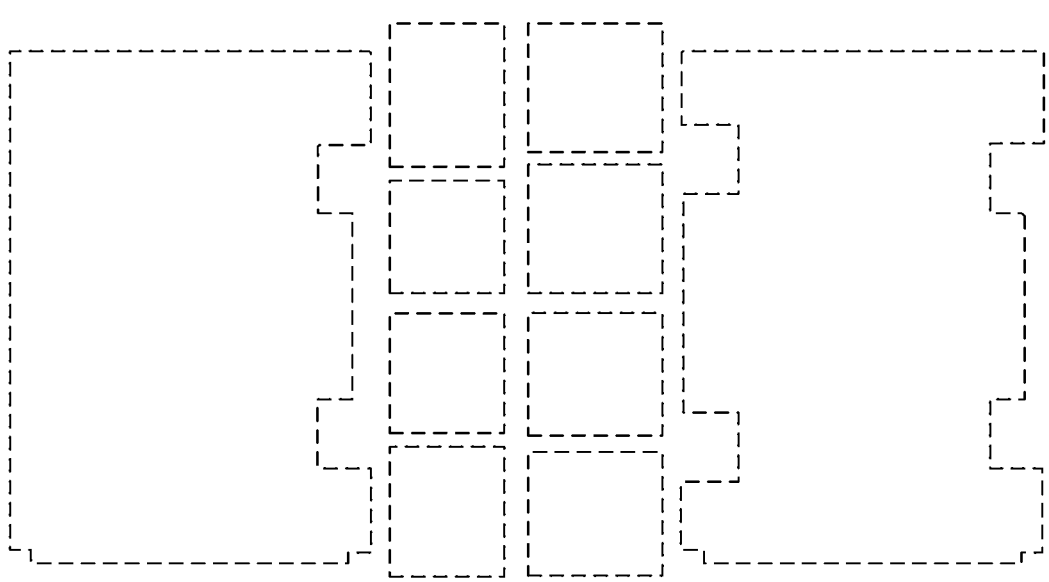
FIG. 26 is a dashed box in FIG. 18.

FIG. 26 is a dashed box in FIG. 18, a pixel definition layer is disposed outside the dashed box and the pixel definition layer is not disposed inside the dashed box.

In at least one embodiment of the present disclosure, a light-shielding layer, a semiconductor layer, a gate metal layer, a source and drain metal layer, an anode layer, an electrode layer and a pixel definition layer are disposed on a base substrate in a stack in the sequence listed.

An interlayer dielectric layer is disposed between the gate metal layer and the source and drain metal layer.

A first insulating layer and a passivation layer are disposed between the source and drain metal layer and the anode layer, the first insulating layer is disposed between the source and drain metal layer and the passivation layer, and the passivation layer is disposed between the first insulating layer and the anode layer. The first insulating layer may be, for example, a resin layer.

In a specific implementation, the anode layer may be made of, but is not limited to, ITO (indium tin oxide).

Figure 27:
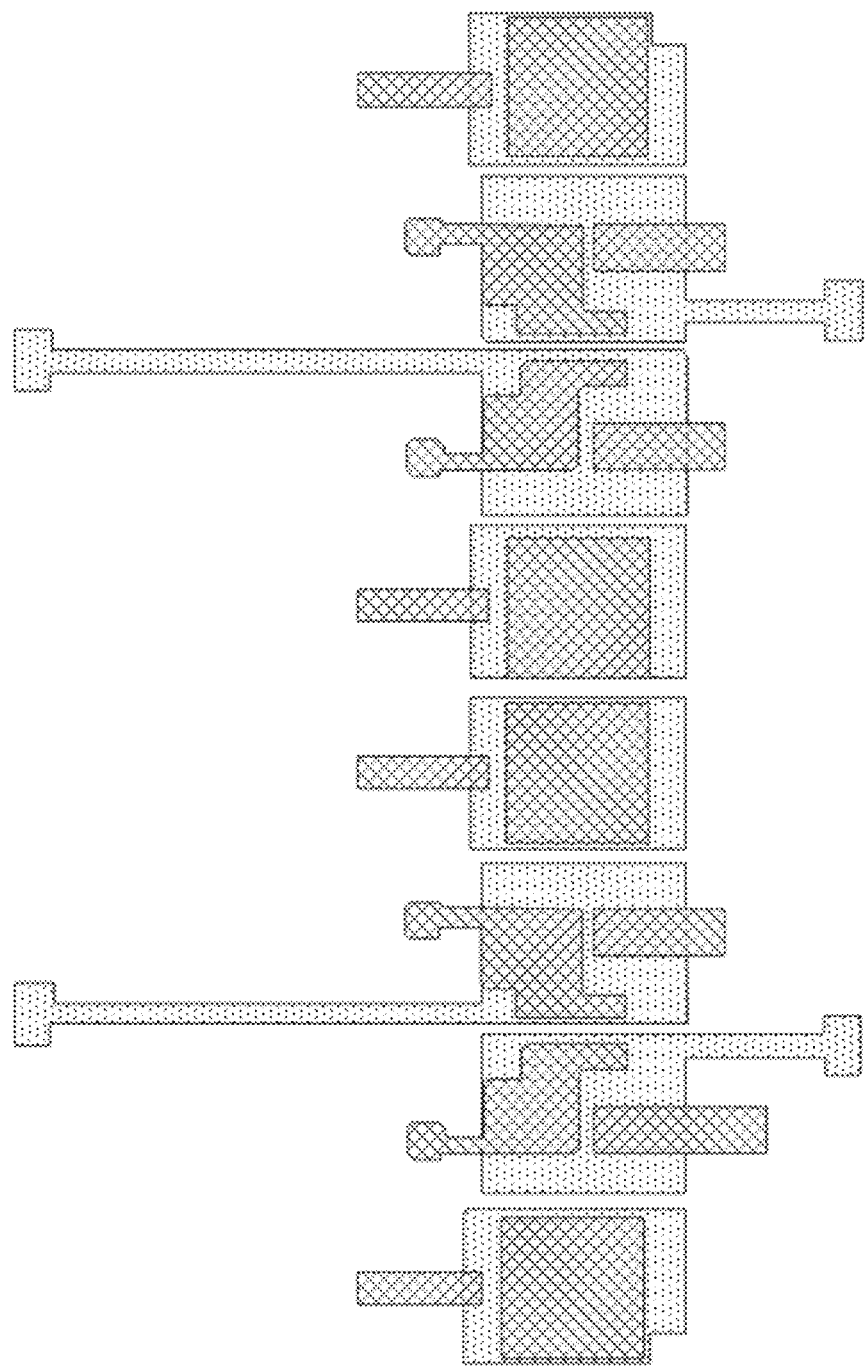
FIG. 27 is a diagram of a stack of the light-shielding layer and the semiconductor layer in FIG. 18.
Figure 28:
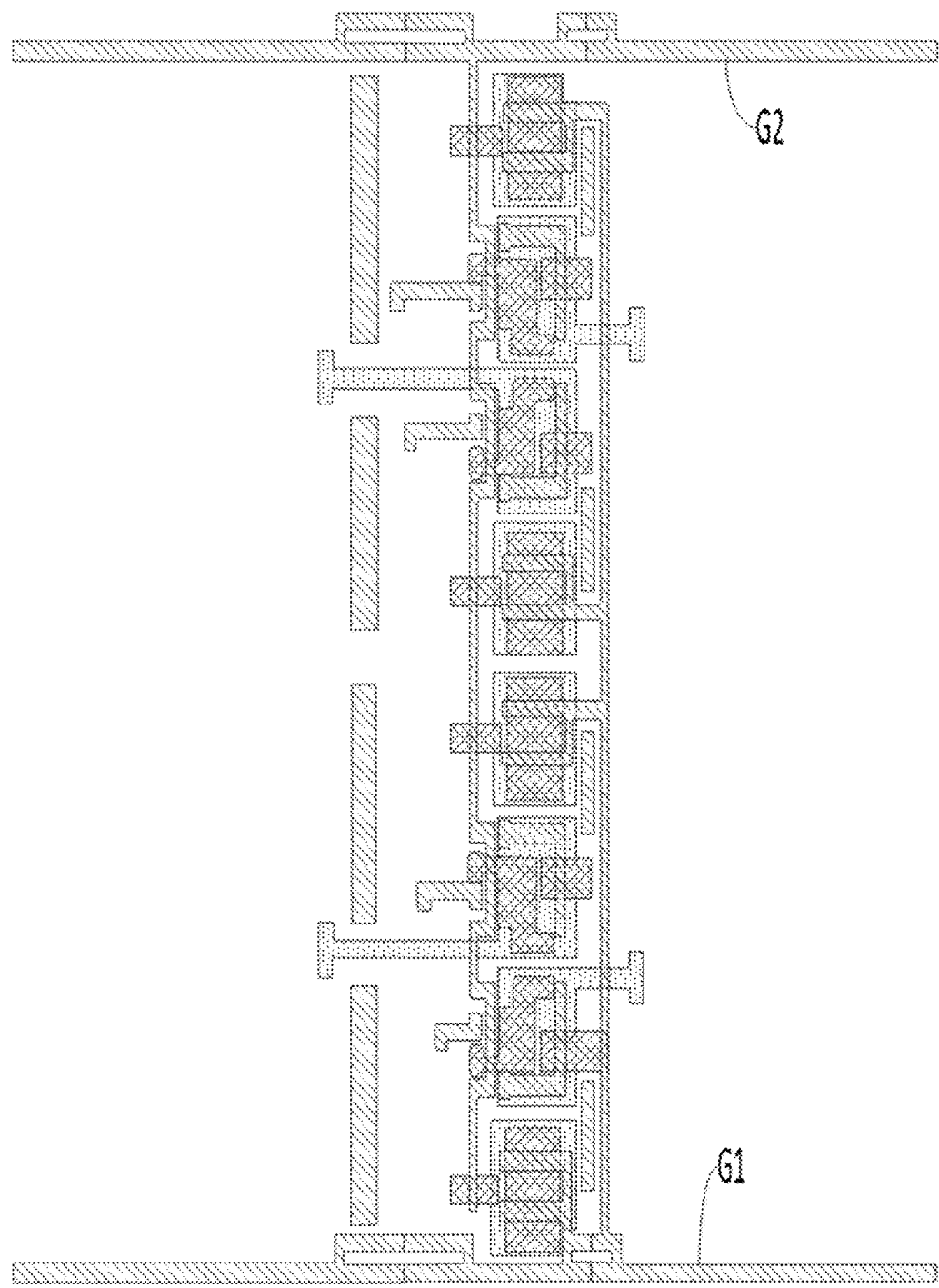
FIG. 28 is a diagram of a stack of the light-shielding layer, the semiconductor layer and the gate metal layer in FIG. 18.

FIG. 27 is a diagram of stacked layers including the light-shielding layer and the semiconductor layer in FIG. 18, and FIG. 28 is a diagram of stacked layers including the light-shielding layer, the semiconductor layer and the gate metal layer in FIG. 18.

Figure 29:
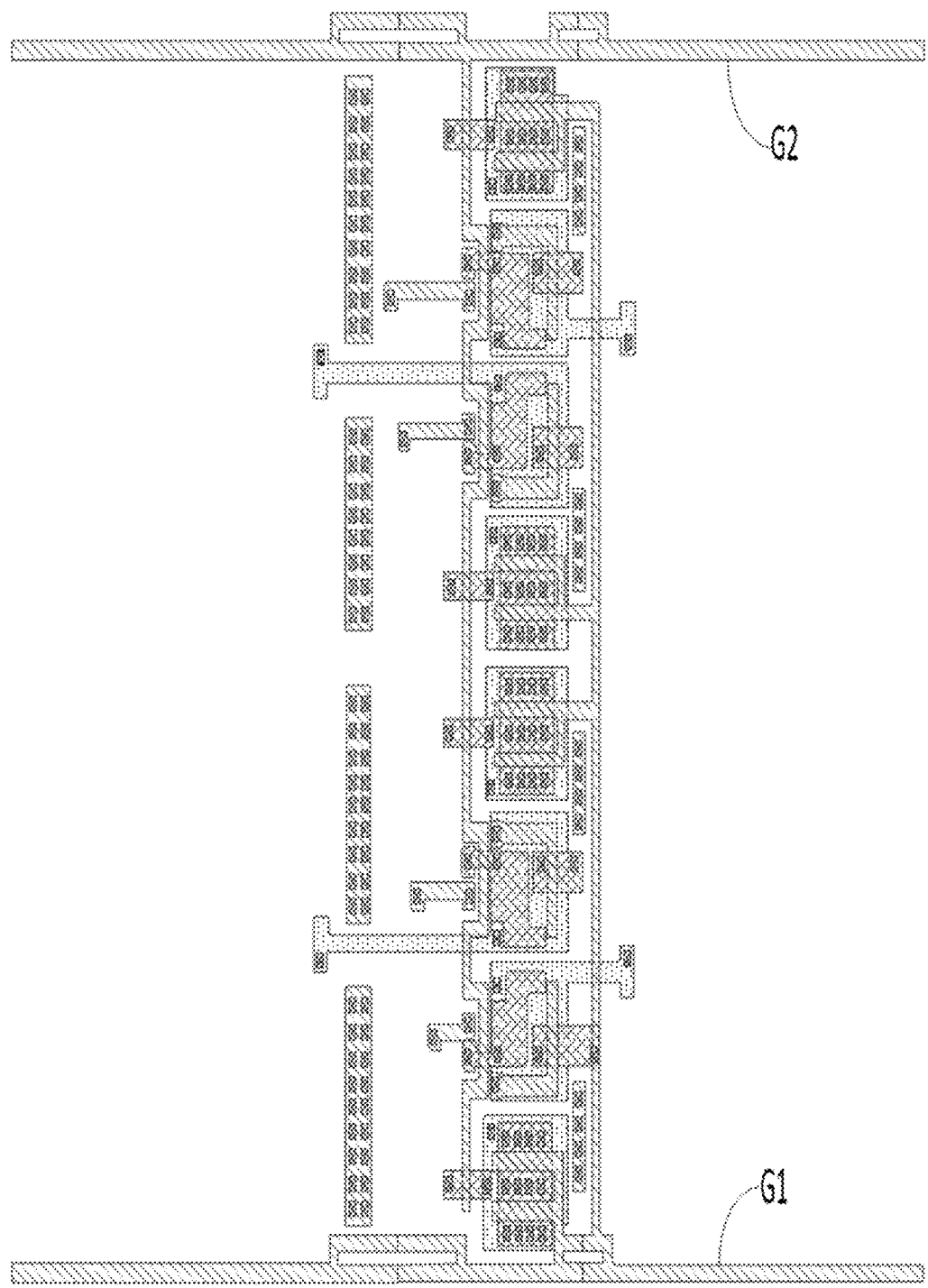
FIG. 29 is a schematic diagram showing via holes penetrating through an interlayer dielectric layer provided on the basis of FIG. 28.

FIG. 29 is a schematic diagram showing via holes penetrating through the interlayer dielectric layer provided on the basis of FIG. 28. In FIG. 29, a box containing "X" denotes a via hole penetrating through the interlayer dielectric layer.

Figure 30:
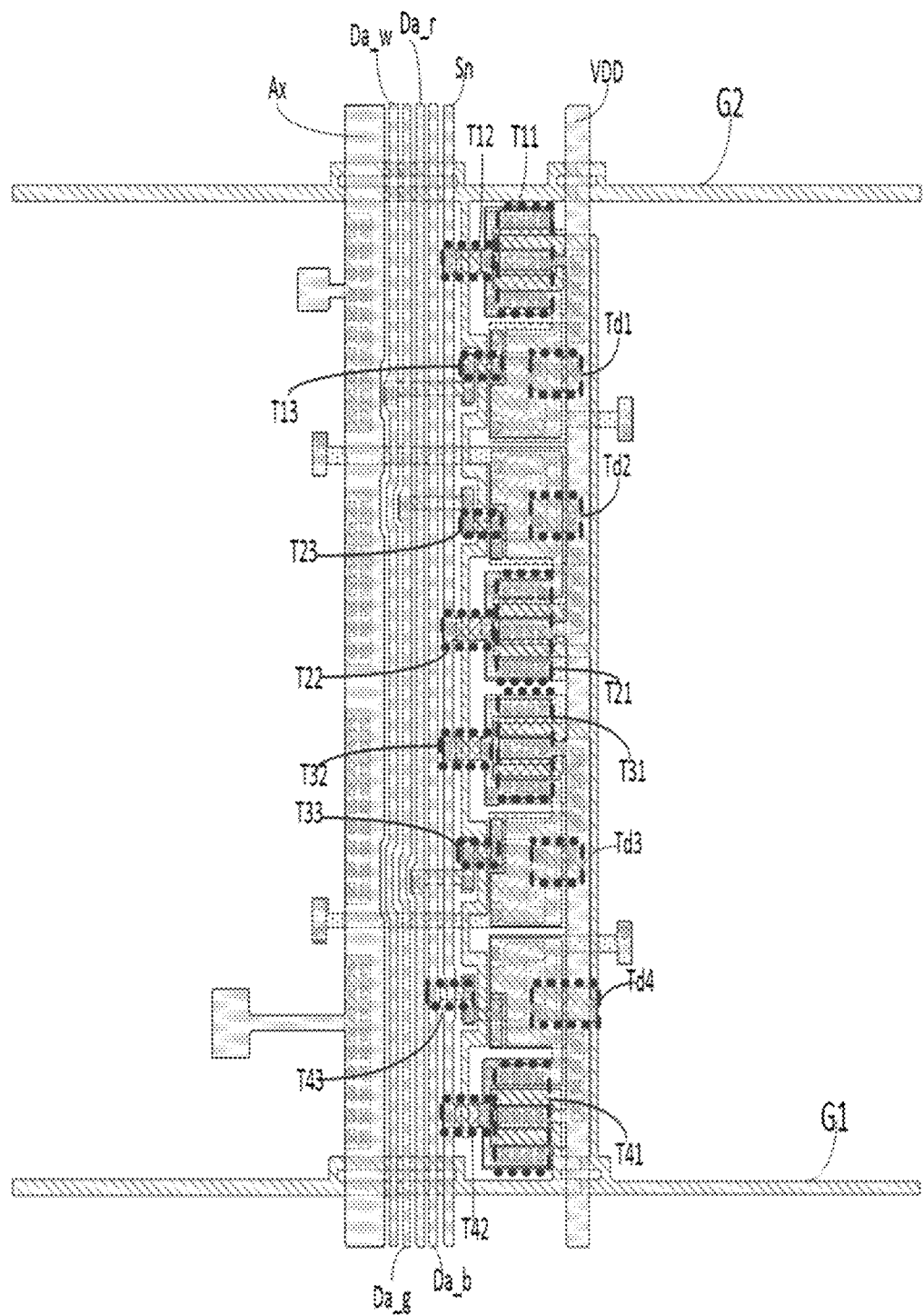
FIG. 30 is a diagram of a stack of the light-shielding layer, the semiconductor layer, the gate metal layer and the source and drain metal layer in FIG. 18.

FIG. 30 is a diagram of stacked layers including the light-shielding layer, the semiconductor layer, the gate metal layer and the source and drain metal layer in FIG. 18.

Figure 31:
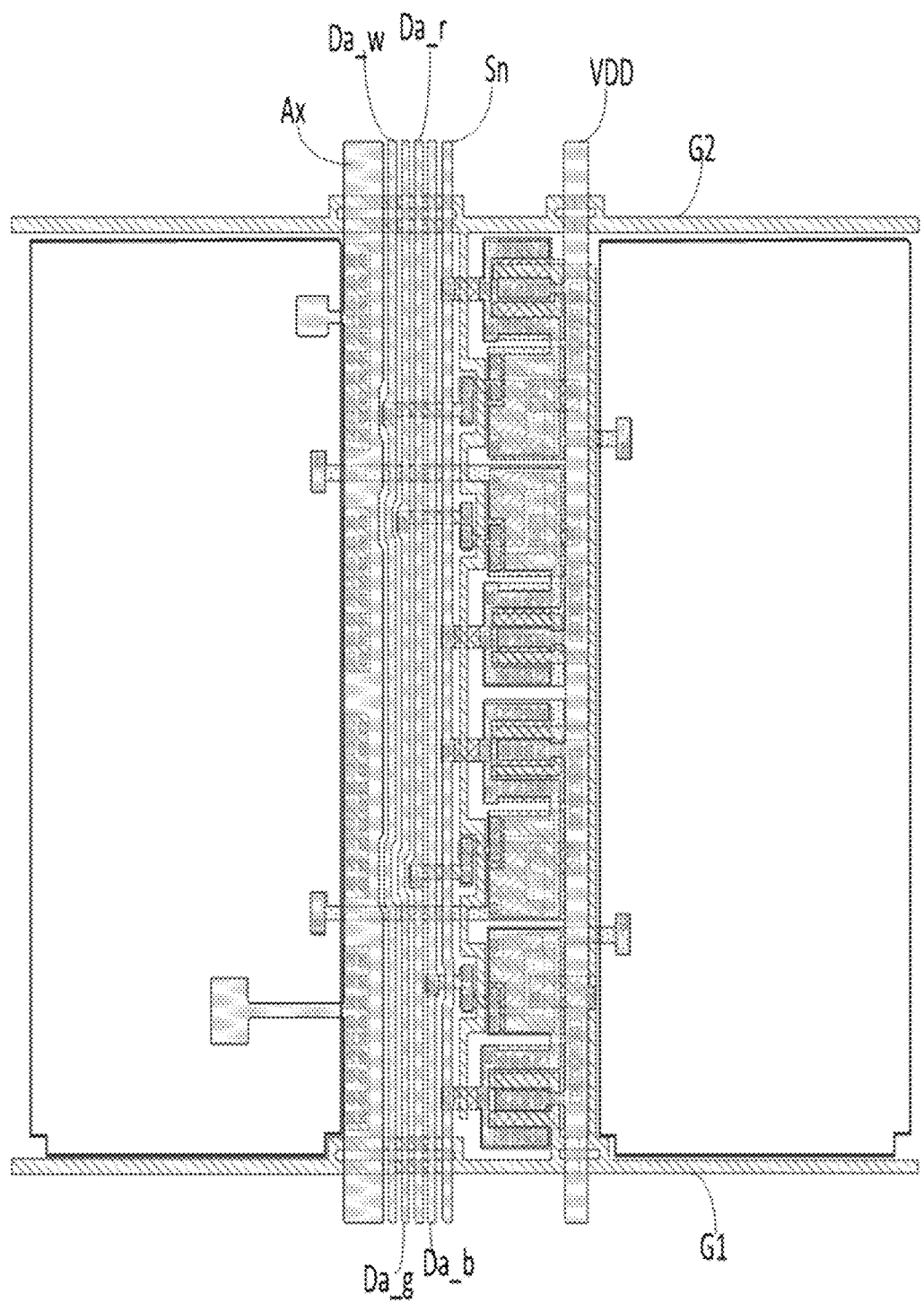
FIG. 31 is a schematic diagram showing the provision of a solid frame FIG. 30.

FIG. 31 is a schematic diagram showing the provision of the solid frame on the basis of FIG. 30. In FIG. 31, the first insulating layer is provided outside the solid line frame, and there is no first insulating layer provided inside the solid line frame.

Figure 32:
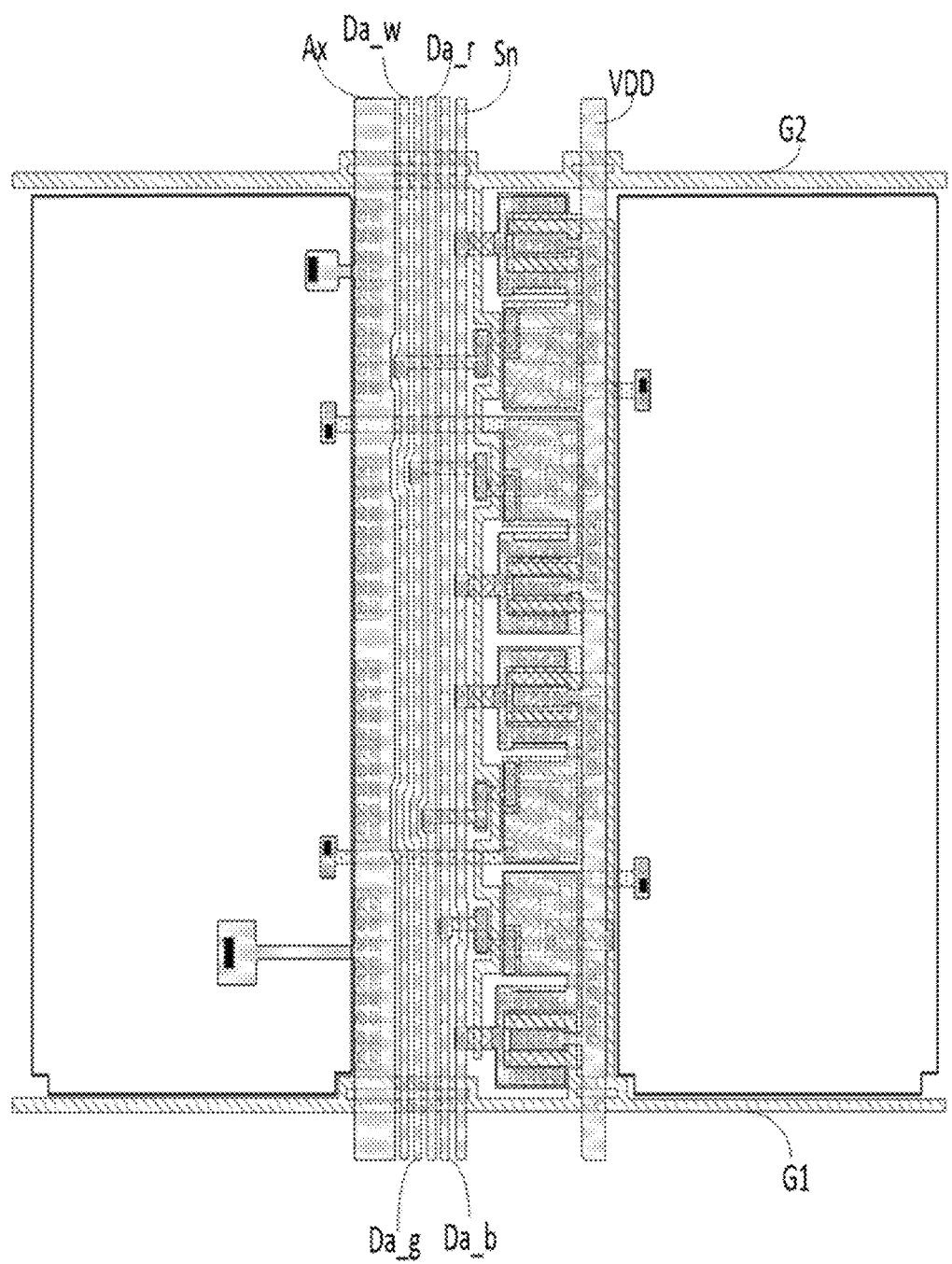
FIG. 32 is a schematic diagram showing via holes penetrating through the passivation layer on the basis of FIG. 31.

FIG. 32 is a schematic diagram showing via holes penetrating through the passivation layer on the basis of FIG. 31. In FIG. 32, a solid black block denotes a via hole penetrating through the passivation layer.

Figure 33:
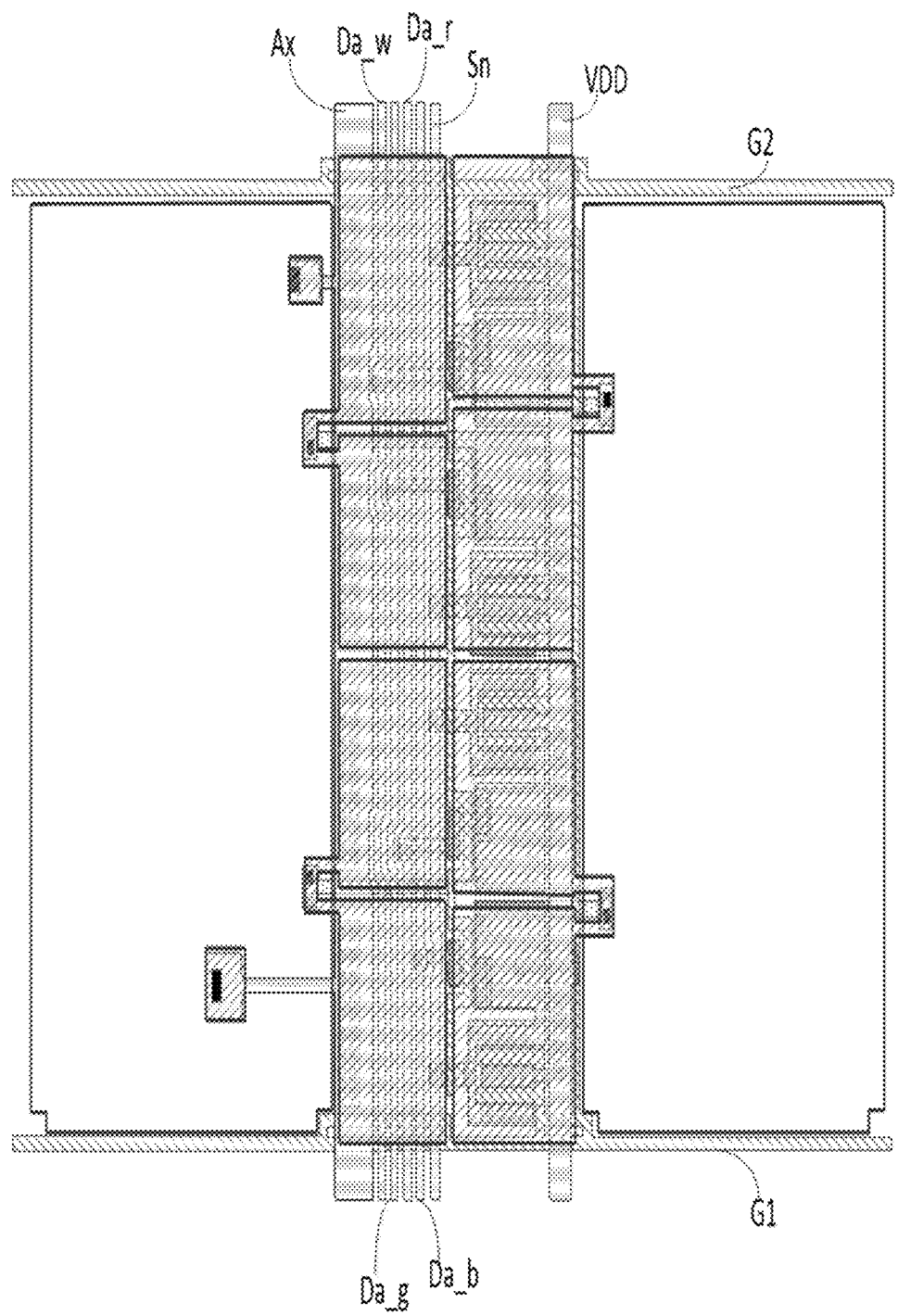
FIG. 33 is a diagram showing stacked layers in which an anode layer is additionally provided on the basis of FIG. 32.

FIG. 33 is a diagram of stacked layers in which an anode layer is additionally provided on the basis of FIG. 32.

Figure 34:
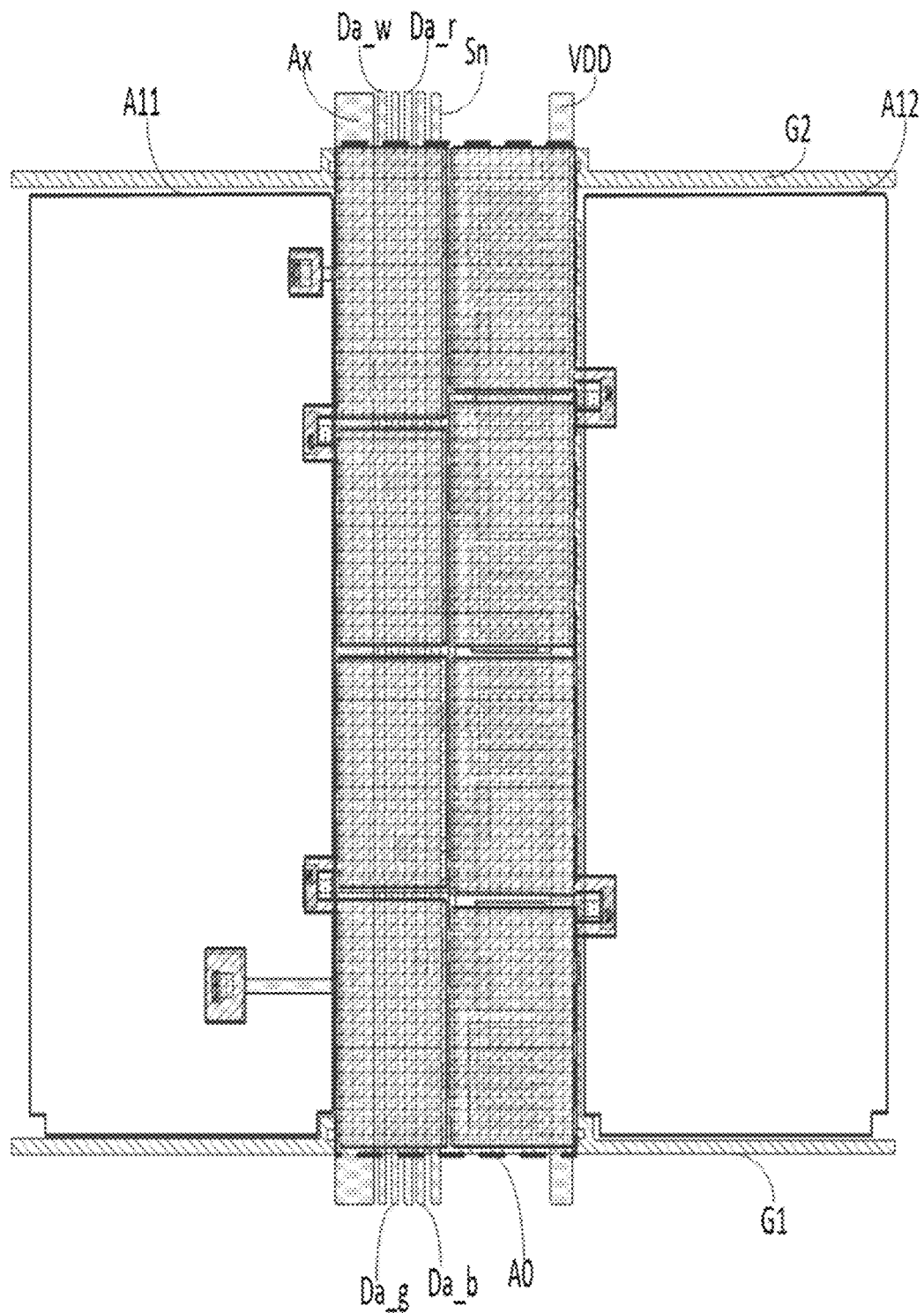
FIG. 34 is a diagram showing stacked layers in which an electrode layer is added on the basis of FIG. 33.

FIG. 34 is a diagram of stacked layers in which an electrode layer is additionally provided on the basis of FIG. 33.

Figure 35:
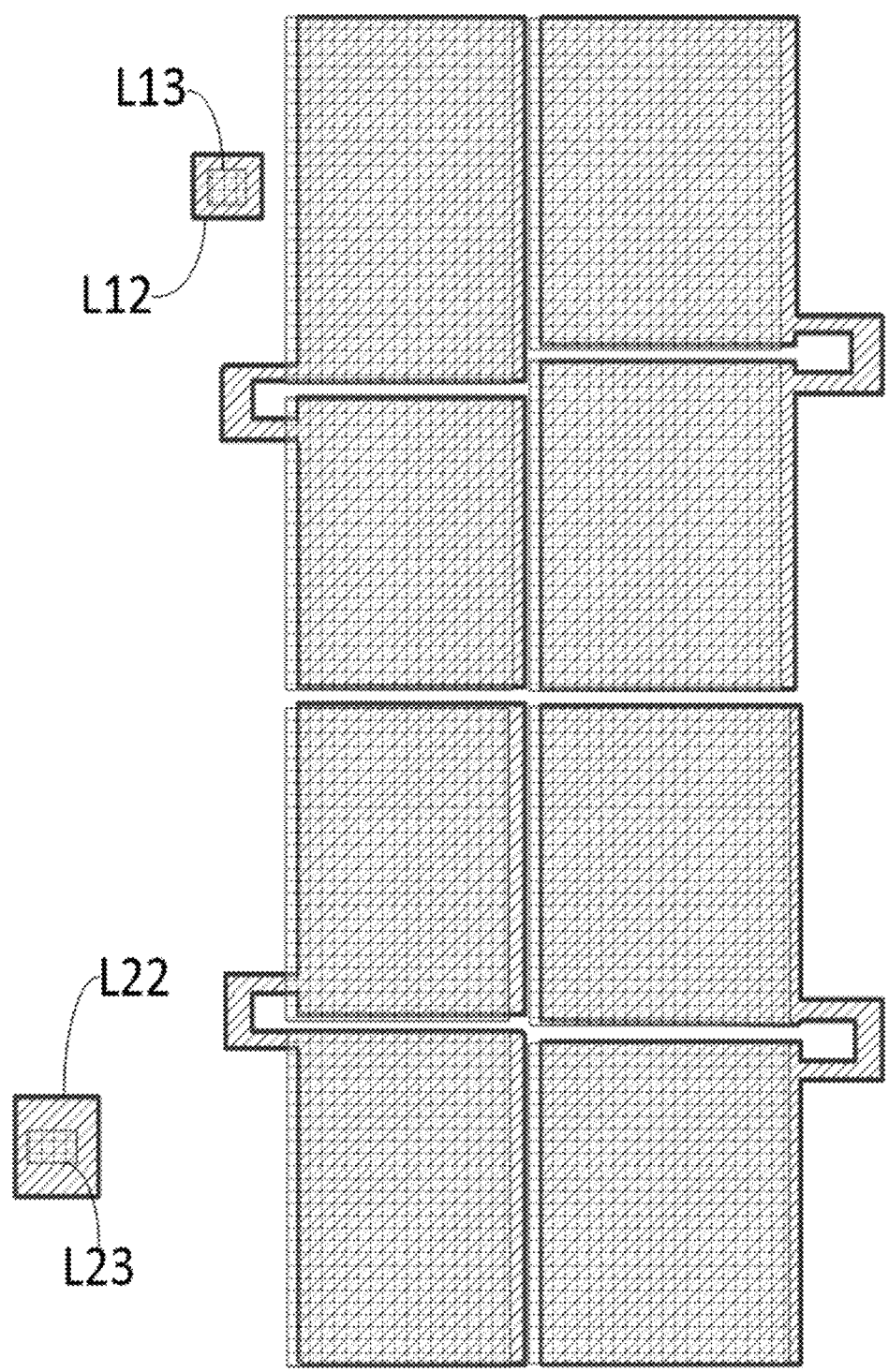
FIG. 35 is a schematic diagram of a stack of the anode layer and the electrode layer in FIG. 18.

FIG. 35 is a schematic diagram of stacked layers including the anode layer and the electrode layer of FIG. 18.

Figure 36:
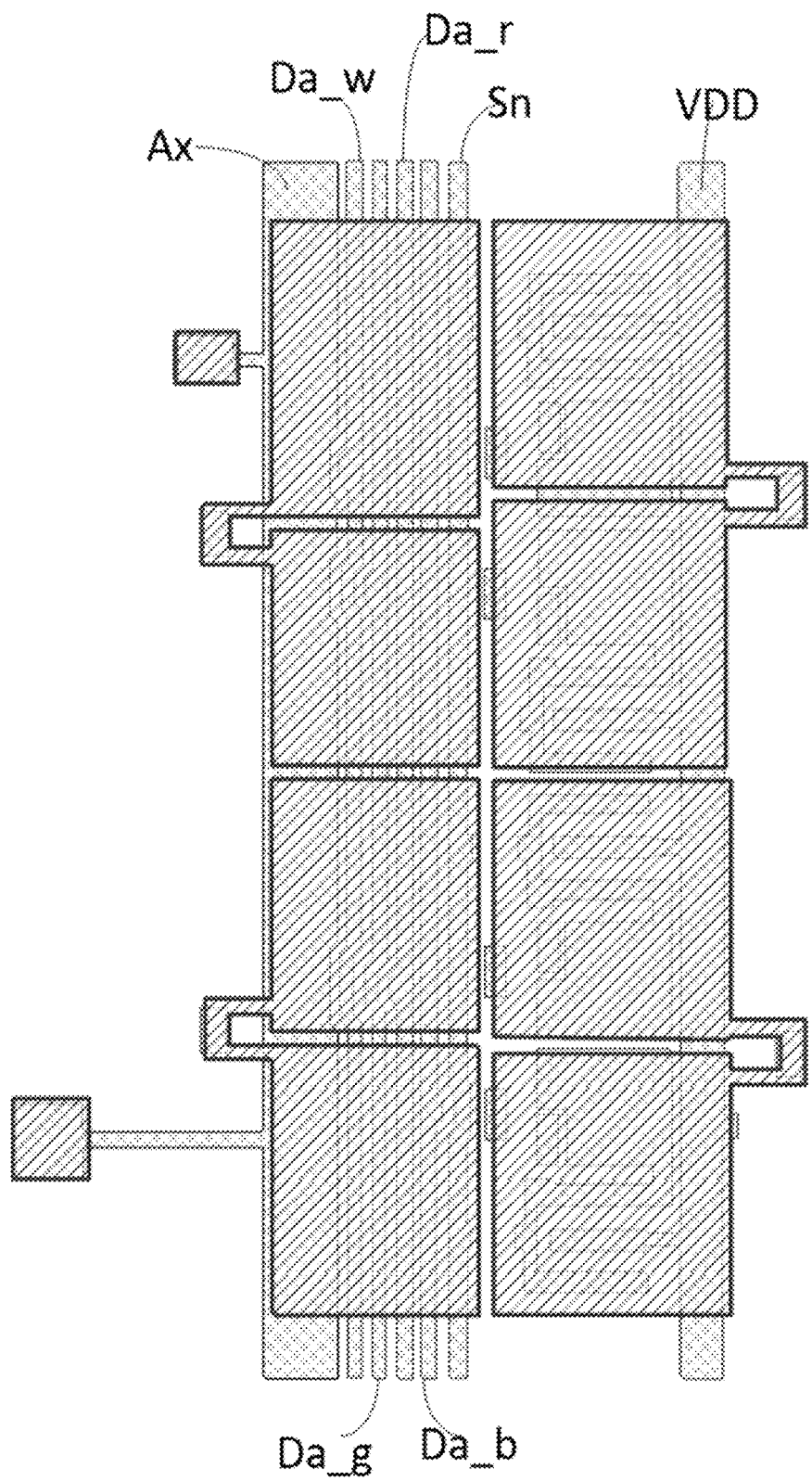
FIG. 36 is a schematic diagram of a stack of the source and drain metal layer and the anode layer in FIG. 18.

FIG. 36 is a schematic diagram of stacked layers including the source and drain metal layer and the anode layer of FIG. 18.

In FIG. 30, reference sign Ax denotes an auxiliary cathode electrode line, reference sign Da_w denotes a white data line, reference sign Da_g denotes a green data line, reference sign Da_r is a red data line, reference sign Da_b denotes a blue data line, reference sign Sn denotes an external compensation line, and reference sign VDD denotes a power supply voltage line.

Reference sign T11 denotes a 1-st first transistor, reference sign T12 denotes a 1-st second transistor, reference sign T13 denotes a 1-st third transistor, and reference sign Td1 denotes a first driving transistor.

Reference sign T21 denotes a 2-nd first transistor, reference sign T22 denotes a 2-nd second transistor, reference sign T23 denotes a 2-nd third transistor, and reference sign Td2 denotes a second driving transistor.

Reference sign T31 denotes a 3-rd first transistor, reference sign T32 denotes a 3-rd second transistor, reference sign T33 denotes a 3-rd third transistor, and reference sign Td3 denotes a third driving transistor.

Reference sign T41 denotes a 4-th first transistor, reference sign T42 denotes a 4-th second transistor, reference sign T43 denotes a 4-th third transistor, and reference sign Td4 denotes a fourth driving transistor.

In FIG. 19, a first plate portion included by a first plate of C11 is denoted as C11a1, a first plate portion included by a first plate of C12 is denoted as C12a1, a first plate portion included by a first plate of C13 is denoted as C13a1, a first plate portion included by a first plate of C14 is denoted as C14a1.

Reference sign Z12 denotes a 1-st second light shielding pattern, reference sign Z22 denotes a 2-nd second light shielding pattern, reference sign Z32 denotes a 3-rd second light shielding pattern, and reference sign Z42 denotes a 4-th second light shielding pattern.

C11a1 is electrically connected to a first connection portion L1, C12a1 is electrically connected to a second connection portion L2, C13a1 is electrically connected to a third connection portion L3, and C14a1 is electrically connected to a fourth connection portion L5.

In FIG. 24, reference sign An11 denotes an anode of O11, reference sign An12 denotes an anode of O12, reference sign An21 denotes an anode of O21, reference sign An22 denotes an anode of O22, reference sign An31 denotes an anode of O31, reference sign An32 denotes an anode of O32, reference sign An41 denotes an anode of O41, and reference sign An42 denotes an anode of O42.

As shown in FIGS. 18 to 36, L1 is electrically connected to An11 and An12 through via holes, so that C11a1 is electrically connected to An11 and An12.

L2 is electrically connected to An21 and An22 through via holes, such that C12a1 is electrically connected to An21 and An22.

L3 is electrically connected to An31 and An32 through via holes, so that C13a1 is electrically connected to An31 and An32.

L4 is electrically connected to An41 and An42 through via holes, such that C14a1 is electrically connected to An41 and An42.

In FIG. 20, reference sign C11b denotes a second plate of C11, reference sign C12b denotes a second plate of C12, reference sign C13b denotes a second plate of C13, and reference sign C14b denotes a second plate of C14.

In at least one embodiment of the present disclosure, the auxiliary cathode electrode line is electrically connected to a first connection pattern.

The first connection pattern is electrically connected to a second connection pattern, and the first connection pattern and the second connection pattern are located in different layers; the second connection pattern is disposed at a same layer as the anode of the light-emitting element.

The second connection pattern is electrically connected to a third connection pattern, and the third connection pattern is disposed on a side of the second connection pattern away from the base substrate.

the third connection pattern is electrically connected to the cathode of the light-emitting element, and the cathode of the light-emitting element is disposed at a side of the third connection pattern away from the base substrate.

In a specific implementation, the first connection pattern may be formed in the source and drain metal layer, the second connection pattern may be formed in the anode layer, and the third connection pattern may be formed in the electrode layer, but the present disclosure is not limited thereto.

In FIG. 22, reference sign Ax denotes an auxiliary cathode electrode line, reference sign Sn denotes an external compensation line, reference sign VDD denotes a power supply voltage line, reference sign Da_w denotes a white data line, reference sign Da_g denotes a green data line, reference sign Da_r denotes a red data line, and reference sign Da_b denotes a blue data line.

As shown in FIG. 22, the auxiliary cathode electrode line Ax is electrically connected to a 1-st first connection pattern L11 and a 2-nd first connection pattern L21.

In FIG. 22, reference sign C11a2 denotes a second plate portion included in a first plate of C11, C12a2 denotes a second plate portion included in a first plate of C12, reference sign C13a2 is denotes a second plate portion included in a first plate of C13, and reference sign C14a2 denotes a second plate portion included in a first plate of C14.

In FIG. 24, reference sign L12 denotes a 1-st second connection pattern, and reference sign L22 denotes a 2-nd second connection pattern.

In FIG. 25, reference sign L13 denotes a 1-st third connection pattern, and reference sign L23 denotes a 2-nd third connection pattern.

As shown in FIGS. 18 to 36, L11, L12, and L13 are electrically connected, and L21, L22, and L23 are electrically connected.

In at least one embodiment of the present disclosure, L13 is electrically connected to the cathode layer and L23 is electrically connected to the cathode layer, such that the auxiliary cathode electrode line Ax is electrically connected to the cathode of the organic light emitting diode in each pixel circuit.

The cathode of the organic light-emitting diode in each pixel circuit is formed in the cathode layer, and the cathode layer is disposed at a side of the electrode layer away from the base substrate.

Optionally, an orthographic projection of the third connection pattern onto the base substrate is within an orthographic projection of the second connection pattern onto the base substrate.

As shown in FIG. 35, an orthographic projection of L13 onto the base substrate is within an orthographic projection of L12 onto the base substrate and an orthographic projection of L23 onto the base substrate is within the orthographic projection of L22 onto the base substrate.

In at least one embodiment of the present disclosure, the 1-st second connection pattern L12 formed in the anode layer and the 1-st third connection pattern L13 formed in the electrode layer form a RIB structure, which functions as an auxiliary electrode. The 2-nd second connection pattern L22 formed in the anode layer and the 2-nd third connection pattern L23 formed in the electrode layer form a RIB structure, which functions as an auxiliary electrode.

In a specific implementation, an area of the 1-st third connection pattern L13 is smaller than an area of the 1-st second connection pattern L12, an area of the 2-nd third connection pattern L23 is smaller than an area of the 2-nd second connection pattern L22, the orthographic projection of the 1-st third connection pattern L13 onto the base substrate is within the orthographic projection of the 1-st second connection pattern L12 onto the base substrate, the orthographic projection of the 2-nd third connection pattern L23 onto the base substrate is within the orthographic projection of the 2-nd second connection pattern L22 onto the base substrate. As such, the 1-st third connection pattern L13 and the 2-nd third connection pattern L23 may form an inverted trapezoidal connection pattern, a gap having a shape of "H" rotated by 90 degrees is formed at the electrode layer, the light-emitting material layer is provided at a side of the electrode layer away from the base substrate. At the gap having shape of "H" rotated by 90 degrees, the light-emitting material layer is break down, then a cathode layer is provided at a side of the light-emitting material layer away from the base substrate. The cathode layer will be electrically connected to the 1-st second connection pattern L12 and the 2-nd second connection pattern L22, so that the auxiliary cathode electrode line Ax is electrically connected to the cathode layer, so as to reduce the resistance of the cathode layer and reduce IR Drop at the cathode (IR drop, referring to a phenomenon that indicates a drop or rise in voltages on the power supply and ground network in the integrated circuit).

In at least one embodiment of the present disclosure, the pixel circuit includes a light-emitting element; the display substrate further includes a reflective electrode.

The reflective electrode is disposed between an anode of the light-emitting element and a cathode of the light-emitting element.

An orthographic projection of the reflective electrode onto the base substrate at least partially overlaps with an orthographic projection of the anode of the light-emitting element onto the base substrate; where the reflective electrode is opaque.

The reflective electrode is electrically connected to the anode of the light-emitting element.

In a specific implementation, an electrode layer may be disposed between the anode layer and a pixel definition layer.

Since the light-emitting element may be a top-emission light-emitting element, and the anode of the top-emission light-emitting element is a reflective anode, in at least one embodiment of the present disclosure, the electrode layer is disposed between the anode layer and the pixel definition layer, where the electrode layer may include a metal layer and a conductive layer which are stacked on one another. The metal layer may be, for example, a Cu (copper) layer, a Mo (molybdenum) layer or an alloy layer, and the conductive layer may be made of ITO, but the present disclosure is not limited thereto. The metal layer is disposed between the conductive layer and the anode, and a patterning process may be performed on the electrode layer to make a plurality of reflective electrodes.

In FIG. 25, reference sign F1 denotes a first reflective electrode, reference sign F2 denotes a second reflective electrode, reference sign F3 denotes a third reflective electrode, reference sign F4 denotes a fourth reflective electrode, reference sign F5 denotes a fifth reflective electrode, reference sign F6 denotes a sixth reflective electrode, reference sign F7 denotes a seventh reflective electrode, and reference sign F8 denotes an eighth reflective electrode.

F1, F2, F3, F4, F5, F6, F7 and F8 are opaque.

As shown in FIGS. 18 to 36, an orthographic projection of F1 onto the base substrate at least partially overlaps with an orthographic projection of An11 onto the base substrate, an orthographic projection of F2 onto the base substrate at least partially overlaps with an orthographic projection of An12 onto the base substrate, an orthographic projection of F3 onto the base substrate at least partially overlaps with an orthographic projection of An21 onto the base substrate, an orthographic projection of F4 onto the base substrate at least partially overlaps with an orthographic projection of An22 onto the base substrate, an orthographic projection of F5 onto the base substrate at least partially overlaps with an orthographic projection of An31 onto the base substrate, an orthographic projection of F6 onto the base substrate at least partially overlaps with an orthographic projection of An32 onto the base substrate, an orthographic projection of F7 onto the base substrate at least partially overlaps with an orthographic projection of An41 onto the base substrate, and an orthographic projection of F8 onto the base substrate at least partially overlaps with an orthographic projection of An42 onto the base substrate.

F1 is electrically connected to An11, F2 is electrically connected to An12, F3 is electrically connected to An21, F4 is electrically connected to An22, F5 is electrically connected to An31, F6 is electrically connected to An32, F7 is electrically connected to An41, and F8 is electrically connected to An42.

As shown in FIGS. 18 to 36, Da_w, Da_g, Da_r, Da_b, and Sn may all extend in the vertical direction, Ax extends in the vertical direction and VDD extends in the vertical direction.

Ax, Da_w, Da_g, Da_r, Da_b, and Sn are disposed at the left side of each pixel circuit, and VDD is disposed at the right side of each pixel circuit.

According to an embodiment of the present disclosure, a display device includes the display substrate as described above.

In at least one embodiment of the present disclosure, the display substrate includes a plurality of columns of auxiliary cathode electrode lines, and a plurality of rows of minimum repeating units and a plurality of columns of minimum repeating units disposed on a base substrate.

The minimum repeating unit includes at least three pixel circuits.

The at least three pixel circuits are electrically connected to different data lines, respectively. Each of the at least three pixel circuits is electrically connected to the power supply voltage line and the external compensation line, and each of the at least three pixel circuits is electrically connected to the first scanning line and the second scanning line.

The auxiliary cathode electrode line, the data line, the power supply voltage line, and the external compensation line extend in a third direction, and a portion of the first scanning line and a portion of the second scanning line extend in a first direction, the first direction intersects with the third direction.

Optionally, the first direction may be a horizontal direction and the third direction may be a vertical direction.

As shown in FIG. 18, reference sign Ax denotes an auxiliary cathode electrode line, reference sign Da_w denotes a white data line, reference sign Da_g denotes a green data line, reference sign Da_r denotes a red data line, reference sign Da_b denotes a blue data line, reference sign Sn denotes an external compensation line, reference sign VDD denotes a power supply voltage line, reference sign G2 denotes a second scanning line, and reference sign G1 denotes a first scanning line.

A portion of G2 and a portion of G1 extend in a horizontal direction.

Ax, Da_w, Da_g, Da_r, Da_b, Sn and VDD all extend in the vertical direction.

In at least one embodiment of the present disclosure, the display substrate includes a pixel circuit region and a transparent region; the minimum repeating units are disposed in the pixel circuit region.

The transparent region is disposed at a first side of the pixel circuit region and a second side of the pixel circuit region.

The second scanning line is disposed at a third side of the transparent region, and the first scanning line is disposed at a fourth side of the transparent region, where the third side and the fourth side are opposite sides.

Optionally, the first side may be the left side, the second side may be the right side, the third side may be the upper side, and the fourth side may be the lower side.

In FIG. 34, reference sign A0 denotes a pixel circuit region, reference sign A11 denotes a first transparent region, and reference sign A12 denotes a second transparent region.

In the first transparent region A11 and the second transparent region A12, the first insulating layer and the metal layer are not provided.

In a specific implementation, the pixel definition layer may be transparent.

As shown in FIG. 34, A11 is disposed at the left side of the pixel circuit region A0, and A12 is disposed at the right side of the pixel circuit region A0.

The second scanning line G2 is disposed at the upper side of the pixel circuit region A0, and the first scanning line G1 is disposed at the lower side of the pixel circuit region A0.

In at least one embodiment of the present disclosure, the first scanning line includes at least two first scanning line portions extending in the first direction and at least two second scanning line portions extending in the first direction;

The second scanning line includes at least two third scanning line portions extending in the first direction, and at least two fourth scanning line portions extending in the first direction.

An orthographic projection of the first scanning line portion onto the base substrate partially overlaps with an orthographic projection of the auxiliary cathode electrode line onto the base substrate, the orthographic projection of the first scanning line portion onto the base substrate partially overlaps with an orthographic projection of the data line onto the base substrate, and the orthographic projection of the first scanning line portion onto the base substrate partially overlaps with an orthographic projection of the external compensation line onto the base substrate.

An orthographic projection of the second scanning line portion onto the base substrate partially overlaps with an orthographic projection of the power supply voltage line onto the base substrate.

An orthographic projection of the third scanning line portion onto the base substrate partially overlaps with the orthographic projection of the auxiliary cathode electrode line onto the base substrate, the orthographic projection of the third scanning line portion onto the base substrate partially overlaps with the orthographic projection of the data line onto the base substrate, and the orthographic projection of the third scanning line portion onto the base substrate partially overlaps with the orthographic projection of the external compensation line onto the base substrate.

An orthographic projection of the fourth scanning line portion onto the base substrate partially overlaps with the orthographic projection of the power supply voltage line onto the base substrate.

In a specific implementation, orthographic projections of the at least two first scanning line portions onto the base substrate partially overlaps with the orthographic projection portion of the auxiliary cathode electrode line onto the base substrate, the orthographic projections of the at least two first scanning line portions onto the base substrate partially overlaps with the orthographic projection portion of the data line onto the base substrate, and the orthographic projections of at least two first scanning line portions onto the base substrate partially overlaps with the orthographic projection portion of the external compensation line onto the base substrate. In this way, when one of the first scanning line portions is short-circuited with at least one of the auxiliary cathode electrode line, the data line and the external compensation line, the one first scanning line portion can be cut off by a laser, and the first scanning line can still transmit the first scanning signal.

Orthographic projections of at least two second scanning line portions onto the base substrate partially overlaps with the orthographic projection of the power supply voltage line onto the base substrate. In this way, when one of the second scanning line portions is short-circuited with the power supply voltage line, the one second scanning line portion can be cut off by a laser, and the first scanning line can still transmit the first scanning signal.

Orthographic projections of at least two third scanning line portions onto the base substrate partially overlaps with the orthographic projection of the auxiliary cathode electrode line onto the base substrate, the orthographic projections of at least two third scanning line portions onto the base substrate partially overlaps with the orthographic projection of the data line onto the base substrate, and the orthographic projections of at least two third scanning line portions onto the base substrate partially overlaps with the orthographic projection of the external compensation line onto the base substrate. In this way, when one of the third scanning line portions is short-circuited with at least one of the auxiliary cathode electrode line, the data line and the external compensation line, the one third scanning line portion can be cut off by a laser, and the second scanning line can still transmit the second scanning signal.

Orthographic projections of at least two fourth scanning line portions onto the base substrate partially overlaps with the orthographic projection of the power supply voltage line onto the base substrate. In this way, when one of the fourth scanning line portions is shorted-circuited with the power supply voltage line, the one fourth scanning line portion can be cut by the laser, and the second scanning line can still transmit the second scanning signal.

As shown in FIG. 21, reference sign G11 denotes a 1-st first scanning line portion, reference sign G21 denotes a 2-nd first scanning line portion, reference sign G12 denotes a 1-st second scanning line portion, and reference sign G22 denotes a 2-nd second scanning line portion.

Reference sign G13 denotes a 1-st third scanning line portion, reference sign G23 denotes a 2-nd third scanning line portion, reference sign G14 denotes a 1-st fourth scanning line portion, and reference sign G24 denotes a 2-nd fourth scanning line portion.

As shown in FIGS. 21 and 30, an orthographic projection of G11 onto the base substrate partially overlaps with an orthographic projection of Ax onto the base substrate, and an orthographic projection of G21 onto the base substrate partially overlaps with the orthographic projection of Ax onto the base substrate. The orthographic projection of G11 onto the base substrate partially overlaps with an orthographic projection of Da_w onto the base substrate, and the orthographic projection of G21 onto the base substrate partially overlaps with the orthographic projection of Da_w onto the base substrate. The orthographic projection of G11 onto the base substrate partially overlaps with the orthographic projection of Da_g onto the base substrate, and the orthographic projection of G21 onto the base substrate partially overlaps with the orthographic projection of Da_g onto the base substrate. The orthographic projection of G11 onto the base substrate partially overlaps with an orthographic projection of Da_r onto the base substrate, and the orthographic projection of G21 onto the base substrate partially overlaps with the orthographic projection of Da_r onto the base substrate. The orthographic projection of G11 onto the base substrate partially overlaps with an orthographic projection of Da_b onto the base substrate, and the orthographic projection of G21 onto the base substrate partially overlaps with the orthographic projection of Da_b onto the base substrate. The orthographic projection of G11 onto the base substrate partially overlaps with an orthographic projection of Sn onto the base substrate, and the orthographic projection of G21 onto the base substrate partially overlaps with the orthographic projection of Sn onto the base substrate. In this way, when G11 or G21 is cut off, G1 can still normally provide the first scanning signal.

An orthographic projection of G12 onto the base substrate partially overlaps with an orthographic projection of VDD onto the base substrate, and an orthographic projection of G22 onto the base substrate partially overlaps with the orthographic projection of VDD onto the base substrate. In this way, when G12 or G22 is cut off, G1 can still normally provide the first scanning signal.

An orthographic projection of G13 onto the base substrate partially overlaps with the orthographic projection of Ax onto the base substrate, and an orthographic projection of G23 onto the base substrate partially overlaps with the orthographic projection of Ax onto the base substrate. The orthographic projection of G13 onto the base substrate partially overlaps with the orthographic projection of Da_w onto the base substrate, and the orthographic projection of G23 onto the base substrate partially overlaps with the orthographic projection of Da_w onto the base substrate. The orthographic projection of G13 onto the base substrate partially overlaps with the orthographic projection of Da_g onto the base substrate, and the orthographic projection of G23 onto the base substrate partially overlaps with the orthographic projection of Da_g onto the base substrate. The orthographic projection of G13 onto the base substrate partially overlaps with the orthographic projection of Da_r onto the base substrate, and the orthographic projection of G23 onto the base substrate partially overlaps with the orthographic projection of Da_r onto the base substrate. The orthographic projection of G13 onto the base substrate partially overlaps with the orthographic projection of Da_b onto the base substrate, and the orthographic projection of G23 onto the base substrate partially overlaps with the orthographic projection of Da_b onto the base substrate. The orthographic projection of G13 onto the base substrate partially overlaps with the orthographic projection of Sn onto the base substrate, and the orthographic projection of G23 onto the base substrate partially overlaps with the orthographic projection of Sn onto the base substrate. In this way, when G13 or G23 is cut off, G2 can still normally provide the second scanning signal.

An orthographic projection of G14 onto the base substrate partially overlaps with the orthographic projection of VDD onto the base substrate, and an orthographic projection of G24 onto the base substrate partially overlaps with the orthographic projection of VDD onto the base substrate. In this way, when G14 or G24 is cut off, G2 can still normally provide the second scanning signal.

Figure 37:
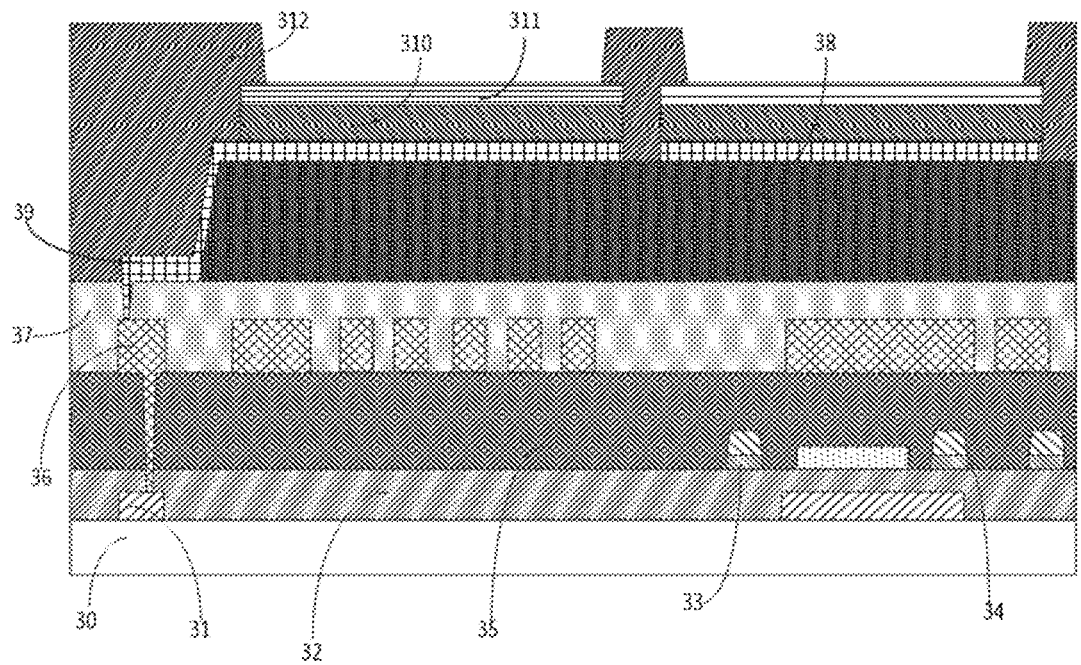
FIG. 37 is a sectional view taken along line A-A' in FIG. 18.

FIG. 37 is a sectional view taken along line A-A' in FIG. 18.

In FIG. 37, reference sign 30 denotes a base substrate, and the base substrate 30 may be a glass substrate, but this is not limiting.

Reference sign 31 denotes a light-shielding layer, reference sign 32 denotes a buffer layer, reference sign 33 denotes a gate insulating layer, reference sign 34 denotes a gate metal layer, reference sign 35 denotes an interlayer dielectric layer, reference sign 36 denotes a source and drain metal layer, reference sign 37 denotes a passivation layer, reference sign 38 denotes a first insulating layer, reference sign 39 denotes an anode layer, reference sign 310 denotes a metal layer, reference sign 311 denotes a conductive layer, and reference sign 312 denotes a pixel definition layer. The metal layer 310 and the conductive layer 311 form an electrode layer.

The first insulating layer 38 may be a resin layer, the metal layer 310 may be made of Cu, Mo or an alloy, and the conductive layer 311 may be made of ITO.

As shown in FIG. 37, provided at the leftmost side is a transparent region. In the transparent region, the anode layer 39 is electrically connected to a connection portion formed in the light-shielding layer 31 through a structure formed in the source and drain metal layer 36, and the connection portion is electrically connected to a second electrode of the driving transistor so as to introduce an anode signal into the light-emitting region. In the transparent region, the first insulating layer is removed to increase the transmittance.

Figure 38:
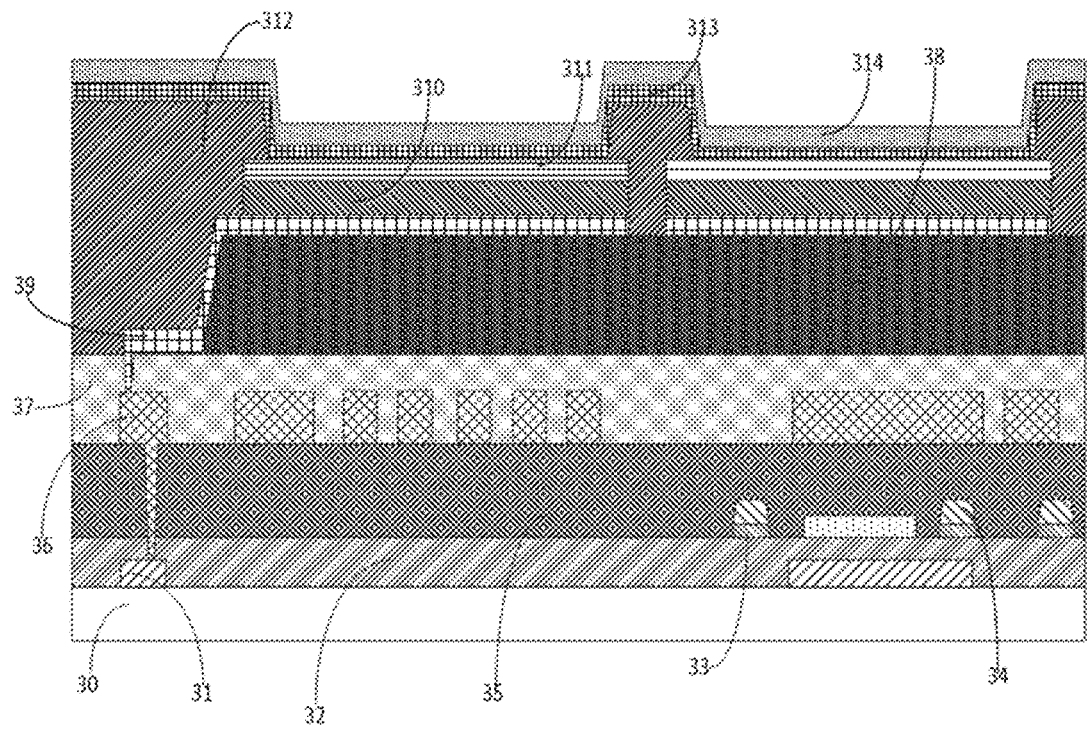
FIG. 38 is a schematic diagram showing a light-emitting material layer and a cathode layer being provided on the basis of FIG. 37.

As shown in FIG. 38, a light-emitting material layer and a cathode layer are provided on the basis of FIG. 37.

In FIG. 38, reference sign 313 denotes the light-emitting material layer, and reference sign 314 denotes the cathode layer.

The display device provided by the embodiments of the present disclosure may be a mobile phone, a tablet computer, a television, a displayer, a notebook computer, a digital photo frame, a navigator, or any product or component with displaying function.

While the foregoing is directed to exemplary embodiments of the present disclosure, it is understood that various modifications and adaptations may be made by those skilled in the art without departing from the principles of the disclosure, and such modifications and adaptations fall within the scope of the disclosure.

What is claimed is:

1. A pixel circuit, comprising: a driving circuit, a control circuit and a light-emitting module; wherein,
a first end of the driving circuit is electrically connected to a power supply voltage line, a second end of the driving circuit is electrically connected to a first end of the light-emitting module, and the driving circuit is configured to generate a driving current for driving the light-emitting module under control of a potential of a control end of the driving circuit;
the control circuit is directly connected to a first scanning line, the power supply voltage line and the first end of the light-emitting module, and the control circuit is configured to control a connection between the power supply voltage line and the first end of the light-emitting module under control of a first scanning signal provided by the first scanning line; and
a second end of the light-emitting module is electrically connected to a cathode voltage line.

2. The pixel circuit according to claim 1, wherein a width-to-length ratio of a transistor comprised in the control circuit is greater than a width-to-length ratio of a transistor comprised in the driving circuit.

3. The pixel circuit according to claim 1, further comprising an energy storage circuit and a data writing circuit;
a first end of the energy storage circuit is electrically connected to the control end of the driving circuit, and a second end of the energy storage circuit is electrically connected to the first end of the light-emitting module; and the energy storage circuit is configured to store electrical energy; and
the data writing circuit is electrically connected to a second scanning line, a data line and the control end of the driving circuit, and the data writing circuit is configured to write a data voltage provided by the data line into the control end of the driving circuit under control of a second scanning signal provided by the second scanning line.

4. The pixel circuit according to claim 3, further comprising an external compensation control circuit;
the external compensation control circuit is electrically connected to the second scanning line, an external compensation line and the second end of the driving circuit, and the external compensation control circuit is configured to control a connection between the external compensation line and the second end of the driving circuit under control of the second scanning signal.

5. The pixel circuit according to claim 4, wherein the energy storage circuit comprises a storage capacitor, the external compensation control circuit comprises a second transistor, and the data writing circuit comprises a third transistor;
a first plate of the storage capacitor is electrically connected to the first end of the light-emitting module, and a second plate of the storage capacitor is electrically connected to the control end of the driving circuit;
a gate electrode of the second transistor is electrically connected to the second scanning line, a first electrode of the second transistor is electrically connected to the external compensation line, and a second electrode of the second transistor is electrically connected to the second end of the driving circuit;
a gate electrode of the third transistor is electrically connected to the second scanning line, a first electrode of the third transistor is electrically connected to the data line, and a second electrode of the third transistor is electrically connected to the control end of the driving circuit.

6. The pixel circuit according to claim 3, wherein the light-emitting module comprises at least two light-emitting elements, or the light-emitting module comprises one light-emitting element;
an anode of the light-emitting element is electrically connected to the first end of the light-emitting module, and a cathode of the light-emitting element is electrically connected to the cathode voltage line.

7. A driving control method, applied to the pixel circuit according to claim 3, the driving control method comprising:
providing a high-voltage signal by the cathode voltage line and providing a low-voltage signal by the power supply voltage line; or providing a low-voltage signal by the cathode voltage line and providing a high-voltage signal by the power supply voltage line; and
writing, by the data writing circuit under control of the second scanning signal, the data voltage provided by the data line into the control end of the driving circuit so as to control the first end of the driving circuit to be disconnected from the second end of the driving circuit, and after the writing, controlling, by the control circuit under control of the first scanning signal, the power supply voltage line to be connected to the first end of the light-emitting module.

8. The pixel circuit according to claim 1, wherein the driving circuit comprises a driving transistor, and the control circuit comprises a first transistor;
a gate electrode of the driving transistor is electrically connected to the control end of the driving circuit, a first electrode of the driving transistor is electrically connected to the power supply voltage line, and a second electrode of the driving transistor is electrically connected to the first end of the light-emitting module;
a gate electrode of the first transistor is electrically connected to the first scanning line, a first electrode of the first transistor is electrically connected to the power supply voltage line, and a second electrode of the first transistor is electrically connected to the first end of the light-emitting module.

9. A display substrate, comprising a base substrate and a plurality of rows of pixel circuits and a plurality of columns of pixel circuits disposed on the base substrate, wherein the pixel circuit comprises: a driving circuit, a control circuit and a light-emitting module;
a first end of the driving circuit is electrically connected to a power supply voltage line, a second end of the driving circuit is electrically connected to a first end of the light-emitting module, and the driving circuit is configured to generate a driving current for driving the light-emitting module under control of a potential of a control end of the driving circuit;
the control circuit is directly connected to a first scanning line, the power supply voltage line and the first end of the light-emitting module, and the control circuit is configured to control a connection between the power supply voltage line and the first end of the light-emitting module under control of a first scanning signal provided by the first scanning line; and
a second end of the light-emitting module is electrically connected to a cathode voltage line.

10. The display substrate according to claim 9, wherein the pixel circuit comprises a driving transistor, a first transistor, a second transistor and a third transistor;
an active layer pattern of the driving transistor, an active layer pattern of the first transistor, an active layer pattern of the second transistor and an active layer pattern of the third transistor are disposed in a same layer;
the active layer pattern of the third transistor and the active layer pattern of the driving transistor are arranged along a first direction;
the active layer pattern of the second transistor and the active layer pattern of the first transistor are arranged along the first direction;
the active layer pattern of the driving transistor and the active layer pattern of the first transistor are arranged along a second direction; and
the first direction intersects with the second direction.

11. The display substrate according to claim 10, further comprising a light shielding pattern, wherein at least a portion of the light shielding pattern is disposed between the active layer pattern of the driving transistor and the base substrate, and the active layer pattern of the driving transistor and the active layer pattern of the first transistor are disposed in a same layer; an orthographic projection of the active layer pattern of the driving transistor onto the base substrate at least partially overlaps with an orthographic projection of the light shielding pattern onto the base substrate;
an orthographic projection of the active layer pattern of the first transistor onto the base substrate at least partially overlaps with the orthographic projection of the light shielding pattern onto the base substrate.

12. The display substrate according to claim 9, wherein the pixel circuit comprises a storage capacitor;
a first plate of the storage capacitor comprises a first plate portion and a second plate portion;
the first plate portion, the second plate of the storage capacitor and the second plate portion are disposed sequentially as a stack along a direction away from the base substrate, and the first plate portion is electrically connected to the second plate portion; and an orthographic projection of the first plate portion onto the base substrate, an orthographic projection of the second plate portion onto the base substrate and an orthographic projection of the second plate onto the base substrate at least partially overlap with each other.

13. The display substrate according to claim 9, wherein the display substrate further comprises an auxiliary cathode electrode line, and the pixel circuit comprises a light-emitting element; the auxiliary cathode electrode line is disposed on a first side of the pixel circuit;
the auxiliary cathode electrode line extends in a third direction, the third direction intersects with the first direction; and
the auxiliary cathode electrode line is electrically connected to a cathode of the light-emitting element.

14. The display substrate according to claim 13, wherein the auxiliary cathode electrode line is electrically connected to an auxiliary connection pattern, and the auxiliary connection pattern and the auxiliary cathode electrode line are disposed in different layers;
wherein the auxiliary cathode electrode line is electrically connected to a first connection pattern;
the first connection pattern is electrically connected to a second connection pattern, and the first connection pattern and the second connection pattern are located in different layers; the second connection pattern and an anode of the light-emitting element are disposed in a same layer;
the second connection pattern is electrically connected to a third connection pattern, and the third connection pattern is disposed at a side of the second connection pattern away from the base substrate; and
the third connection pattern is electrically connected to the cathode of the light-emitting element, and the cathode of the light-emitting element is disposed at a side of the third connection pattern away from the base substrate.

15. The display substrate according to claim 14, wherein an orthographic projection of the third connection pattern onto the base substrate is within an orthographic projection of the second connection pattern onto the base substrate.

16. The display substrate according to claim 9, wherein the pixel circuit comprises a light-emitting element; the display substrate further comprises a reflective electrode;
the reflective electrode is disposed between an anode of the light-emitting element and a cathode of the light-emitting element;
an orthographic projection of the reflective electrode onto the base substrate at least partially overlaps with an orthographic projection of the anode of the light-emitting element onto the base substrate; the reflective electrode is opaque, and the reflective electrode is electrically connected to the anode of the light-emitting element.

17. A display device, comprising a display substrate, wherein the display substrate comprises a base substrate and a plurality of rows of pixel circuits and a plurality of columns of pixel circuits disposed on the base substrate;
wherein the pixel circuit comprises: a driving circuit, a control circuit and a light-emitting module;
a first end of the driving circuit is electrically connected to a power supply voltage line, a second end of the driving circuit is electrically connected to a first end of the light-emitting module, and the driving circuit is configured to generate a driving current for driving the light-emitting module under control of a potential of a control end of the driving circuit;

the control circuit is directly connected to a first scanning line, the power supply voltage line and the first end of the light-emitting module, and the control circuit is configured to control a connection between the power supply voltage line and the first end of the light-emitting module under control of a first scanning signal provided by the first scanning line; and a second end of the light-emitting module is electrically connected to a cathode voltage line.

18. The display device according to claim 17, wherein the display substrate comprises a plurality of columns of auxiliary cathode electrode lines and a plurality of rows of minimum repeating units and a plurality of columns of minimum repeating units disposed on the base substrate;

the minimum repeating unit comprises at least three pixel circuits;

the at least three pixel circuits are electrically connected to different data lines, respectively, and the at least three pixel circuits are electrically connected to the power supply voltage line and the external compensation line;

the at least three pixel circuits are electrically connected to the first scanning line and the second scanning line; and the auxiliary cathode electrode line, the data line, the power supply voltage line, and the external compensation line extend in a third direction, and a portion of the first scanning line and a portion of the second scanning line extend in a first direction, wherein the first direction intersects with the third direction.

19. The display device according to claim 18, wherein the display substrate comprises a pixel circuit region and a transparent region; the minimum repeating units are disposed in the pixel circuit region;

the transparent region is disposed at a first side of the pixel circuit region and a second side of the pixel circuit region; and the second scanning line is disposed at a third side of the transparent region, and the first scanning line is disposed at a fourth side of the transparent region, wherein the third side and the fourth side are opposite sides.

20. The display device according to claim 18, wherein the first scanning line comprises at least two first scanning line portions extending in the first direction, and at least two second scanning line portions extending in the first direction;

the second scanning line comprises at least two third scanning line portions extending in the first direction, and at least two fourth scanning line portions extending in the first direction;

an orthographic projection of the first scanning line portion onto the base substrate partially overlaps with an orthographic projection of the auxiliary cathode electrode line onto the base substrate, the orthographic projection of the first scanning line portion onto the base substrate partially overlaps with an orthographic projection of the data line onto the base substrate, and the orthographic projection of the first scanning line portion onto the base substrate partially overlaps with an orthographic projection of the external compensation line onto the base substrate;

an orthographic projection of the second scanning line portion onto the base substrate partially overlaps with an orthographic projection of the power supply voltage line onto the base substrate;

an orthographic projection of the third scanning line portion onto the base substrate partially overlaps with the orthographic projection of the auxiliary cathode electrode line onto the base substrate, the orthographic projection of the third scanning line portion onto the base substrate partially overlaps with the orthographic projection of the data line onto the base substrate, and the orthographic projection of the third scanning line portion onto the base substrate partially overlaps with the orthographic projection of the external compensation line onto the base substrate; and an orthographic projection of the fourth scanning line portion onto the base substrate partially overlaps with the orthographic projection of the power supply voltage line onto the base substrate.

* * * * *